United States Patent [19]
Mitsuhashi et al.

[11] Patent Number: 5,962,070
[45] Date of Patent: Oct. 5, 1999

[54] SUBSTRATE TREATING METHOD AND APPARATUS

[75] Inventors: Tsuyoshi Mitsuhashi, Kyoyo; Takuya Wada, Kyoto; Koji Hashimoto, Kyoto; Naoyuki Osada, Kyoto, all of Japan

[73] Assignee: Dainippon Screen MFG. Co., Ltd., Kyoto, Japan

[21] Appl. No.: 09/149,438

[22] Filed: Sep. 8, 1998

[30] Foreign Application Priority Data

Sep. 25, 1997 [JP] Japan ..................................... 9-259661
Oct. 7, 1997 [JP] Japan ..................................... 9-274205
Feb. 12, 1998 [JP] Japan ..................................... 10-030197

[51] Int. Cl.$^6$ .............................. B05D 3/12; B05C 11/02; B08B 7/00
[52] U.S. Cl. ............................. 427/240; 118/52; 118/320; 118/321; 134/33; 134/104.2; 134/172; 134/198; 427/385.5; 437/231
[58] Field of Search ................................. 427/240, 385.5; 437/231; 118/52, 320, 321; 134/33, 104.2, 157, 172, 198

[56] References Cited

U.S. PATENT DOCUMENTS

| | | | |
|---|---|---|---|
| 5,427,820 | 6/1995 | Biche et al. | 427/240 |
| 5,571,560 | 11/1996 | Lin | 427/240 |
| 5,695,817 | 12/1997 | Tateyama et al. | 427/240 |

*Primary Examiner*—Janyce Bell
*Attorney, Agent, or Firm*—Nikaido Marmelstein Murray & Oram, LLP.

[57] ABSTRACT

A substrate treating method and apparatus for treating a substrate by supplying a developing solution thereto while spinning the substrate. A nozzle having a plurality of discharge openings for discharging the developer is disposed such that the discharge openings are at different distances from the spin center of the substrate. The developer is discharged from the nozzle while the latter is moved radially of the substrate. The discharge openings then describe loci not overlapping one another over the substrate. The developer is evenly supplied over the substrate to promote the uniformity of development on the substrate surface.

13 Claims, 23 Drawing Sheets

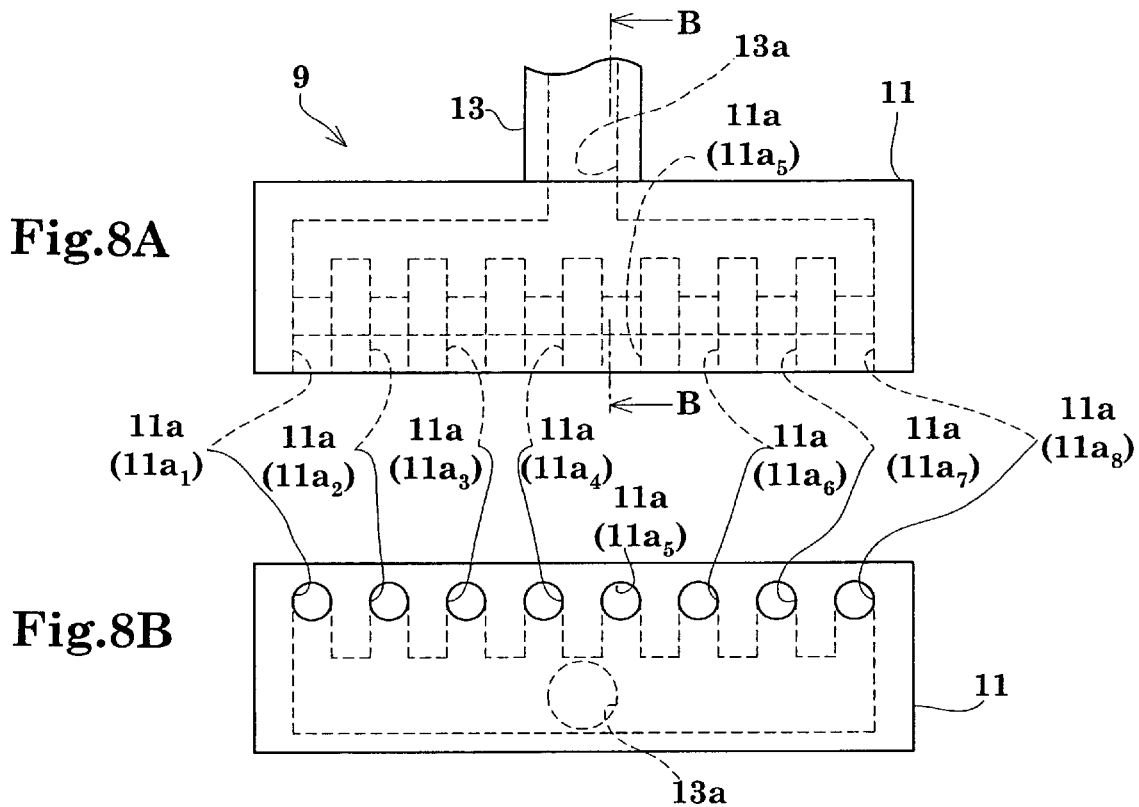
Fig.8A
Fig.8B
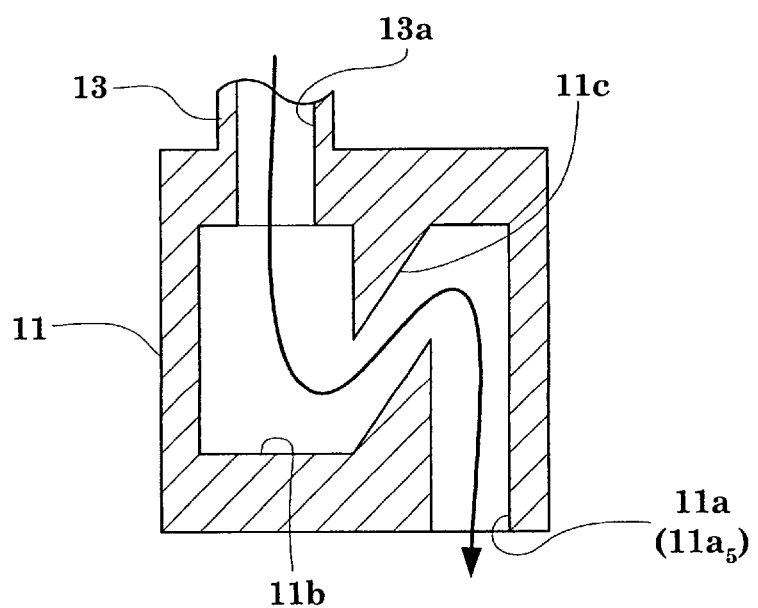
Fig.9

SUBSTRATE TREATING METHOD AND APPARATUS

BACKGROUND OF THE INVENTION (1) Field of the Invention

The present invention relates to methods and apparatus for developing or otherwise treating substrates such as semiconductor wafers, glass substrates for liquid crystal displays, glass substrates for photomasks, and substrates for optical disks. More particularly, the invention relates to a technique of performing a predetermined treatment of substrates by supplying a developer or other treating solution to the substrates in a spin.

(2) Description of the Related Art

A conventional substrate treating apparatus will be described, taking a developing apparatus for example.

FIG. 1 is a view in vertical section of a developer discharge nozzle in a conventional substrate developing apparatus. FIG. 2 is a section taken on line A—A of FIG. 1.

A developer discharge nozzle 100 shown in FIGS. 1 and 2 has a cylindrical nozzle body 100a with a closed bottom. The nozzle body 100a has a plurality of (five in this example) discharge openings 101 (first to fifth discharge openings 101a–101e) formed equidistantly in the circumferential surface thereof A developer supply pipe 102 is connected to an upper surface of nozzle body 100a.

To perform developing treatment of a wafer W with a developer supplied from the nozzle 100 having the above construction, the nozzle 100 is moved to position the first discharge opening 101a over the spin center P of wafer W as shown in FIG. 3, for example. Then, the developer is supplied (as at Q in FIG. 1) while spinning the wafer W. The developer delivered from the nozzle 100 having the discharge openings 101 formed laterally thereof makes only a mild impact on a film coated and exposed on the surface of wafer W. On the other hand, as depicted in concentric circles drawn in two-dot chain lines in FIG. 3, the developer discharged concentrates on and adjacent regions under the second and fifth discharge openings 101b and 101e equidistant from the spin center P, and on and adjacent regions under the third and fourth discharge openings 101c and 101d equidistant from the spin center P. With the concentration of the highly active developer, development progresses faster in the regions along these concentric circles than in the other regions. This results in the problem of impairing uniformity of development over the wafer surface.

To avoid the inconvenience due to the developer concentration in the form of concentric circles, the nozzle 100 is moved radially of the wafer W while supplying the developer to the spinning wafer W.

However, such conventional practice has the following drawback.

When the nozzle 100 is moved over the spinning wafer W, each of the discharge openings 101a–101e of nozzle 100 describes a spiraling locus as shown in a solid line in FIG. 3. The second and fifth discharge openings 101b and 101e equidistant from the spin center P describe similar loci close to each other. The third and fourth discharge openings 101c and 101d equidistant from the spin center P also describe similar loci close to each other. As a result, the developer concentrates along the pairs of loci close to each other, which provides no significant improvement in the uniformity of development.

The above nozzle 100 has the following disadvantages also.

Because of the very construction of nozzle 100, air 103 inevitably collects in an upper space of the nozzle body 100a. When the developer is supplied to the nozzle body 100a through the supply pipe 102, the air 103 in the upper space of the nozzle body 100a is compressed by the flow pressure. The air 103 then expands in reaction thereto. This results in an unsteady discharge of the developer from the discharge openings 101.

Moreover, the air 103 collecting in the upper space of the nozzle body 100a may mix into the developer in the nozzle body 100a. The developer may contain bubbles when supplied from the discharge openings 101 to the upper surface of wafer W. Then, as shown in FIG. 4, the developer Q fails to contact the upper surface of wafer W where bubbles 104 contact the upper surface of wafer W. This causes local defects in development.

Further, when stopping supply of the developer Q to the wafer W, it is conventional practice to stop supplying the developer Q to the nozzle body 100a through the supply pipe 102, leaving the developer Q in the nozzle body 100a as shown in FIG. 5. As noted above, when the developer Q is supplied to the nozzle body 100a through the supply pipe 102, the air 103 in the upper space of the nozzle body 100a is compressed by the flow pressure. The pressure of developer Q acting on the air 103 is eliminated when the developer Q is stopped being supplied to the nozzle body 100a through the supply pipe 102. Then, the air 103 expands as shown in a two-dot chain line in FIG. 5, which causes the developer Q to drip from the nozzle body 100a to the wafer W, thereby jeopardizing uniform treatment.

SUMMARY OF THE INVENTION

The present invention has been made having regard to the state of the art noted above, and its primary object is to provide a substrate treating method and apparatus for diversifying loci of movement of discharge openings to improve uniformity of substrate treatment.

Other objects of the invention are to secure a steady supply of a treating solution to substrates, to supply the treating solution in a bubble-free condition, and to prevent the treating solution dripping to the substrates after stopping supply of the treating solution.

The above objects are fulfilled, according to the present invention, by a substrate treating method for treating a substrate by supplying a treating solution thereto, comprising the steps of arranging a plurality of discharge openings for discharging the treating solution, such that the discharge openings are at different distances from a spin center of the substrate; discharging the treating solution simultaneously from the plurality of discharge openings while spinning the substrate; and moving all of the discharge openings radially of the substrate while discharging the treating solution.

According to the present invention, the treating solution is discharged from the discharge openings arranged at different distances from the spin center of the substrate, thereby avoiding concentration of the treating solution. All the discharge openings are moved together radially of the spinning substrate to supply the treating solution over the entire surface of the substrate without permitting the treating solution to concentrate on any particular regions of the substrate. This effectively promotes uniformity of treatment over the substrate surface.

The above treating method may advantageously be used for supplying a developer to the substrate to perform developing treatment thereof.

In another aspect of the invention, a substrate treating apparatus is provided for treating a substrate by supplying a treating solution thereto, which comprises a spin support device for supporting and spinning the substrate; a treating solution supplying device having a plurality of discharge openings for discharging the treating solution, the discharge openings being arranged at different distances from a spin center of the substrate; and a moving device for moving the treating solution supplying device radially of the substrate.

According to this apparatus, the treating solution is supplied from the treating solution supplying device having a plurality of discharge openings arranged at different distances from the spin center, to the substrate supported on the spin support device. Thus, the treating solution is prevented from concentrating on any particular regions of the substrate. By moving the treating solution supplying device radially of the substrate by means of the moving device, the treating solution may be supplied over the entire surface of the substrate while avoiding concentration of the treating solution.

A preferred example of the above substrate treating apparatus is a substrate developing apparatus for supplying a developer to the substrate to perform developing treatment thereof.

Preferably, the treating solution supplying device comprises a nozzle having the plurality of discharge openings. Then, the treating solution supplying device has a simplified construction.

Preferably, the plurality of discharge openings are formed in a bottom of the nozzle or laterally of the nozzle.

Preferably, the plurality of discharge openings are arranged in a linear row, or in two rows and in a staggered relationship.

It is preferred that at least part of the plurality of discharge openings are arranged to follow an outer edge of the substrate. With this construction, even where only a narrow space is provided between the edge of the substrate and an inner edge of a cup, the discharge openings of the nozzle may be arranged between the edge of the substrate and the inner edge of the cup. When starting to supply the treating solution, the treating solution may be allowed to drip into the space between the edge of the substrate and the inner edge of the cup, to avoid the impact of the solution being applied to the surface of the substrate. Thus, a defective treatment due to the impact of the treating solution occurring upon start of its supply may be avoided while maintaining the performance of the cup.

In the above apparatus, the moving device, preferably, is operable to swing the nozzle radially of the substrate, or to move the nozzle linearly radially of the substrate.

Preferably, the nozzle includes a nozzle body having the plurality of discharge openings formed in a bottom thereof, the nozzle body defining a trap for receiving the treating solution, a plurality of discharge passages extending upward from the plurality of discharge openings, respectively, and a plurality of communicating passages for communicating the discharge passages with the trap, the plurality of communicating passages being reversing passages for leading the treating solution from a lower end of the trap to upper ends of the discharge passages. With this construction, the treating solution supplied to the trap inside the nozzle body is reversed through the reversing passages to flow into the upper ends of the discharge passages. The treating solution then flows down the discharge passages to the discharge openings to be discharged therefrom. In the nozzle body, air has a tendency to remain in upper regions of the reversing passages. From the reversing passages, the treating solution flows into the discharge passages leading to the discharge openings. The flow is changed from upward to downward for discharge from the discharge openings. The air in the upper regions of the reversing passages is discharged with the treating solution from the discharge openings. Thus, the nozzle is constructed not to permit air to remain inside.

Preferably, the discharge passages are formed thinner than the reversing passages. This construction permits air to be discharged smoothly with the treating solution.

The reversing passages may be inclined passages extending from the lower end of the trap to the upper ends of the discharge passages.

Preferably, the substrate treating apparatus according to the present invention is operable, when the discharge openings are displaced from above the substrate, to supply the treating solution into the nozzle body and discharge the treating solution from the discharge openings, thereby to discharge air with the treating solution from the nozzle body, and after discharging the air from the nozzle body, to supply the treating solution to the substrate. With this construction, when the discharge openings are displaced from above the substrate, the treating solution is supplied into the nozzle body to discharge air with the treating solution from the nozzle body. The air in the nozzle body can be discharged with the treating solution instead of supplying the treating solution with air (bubbles) mixed therein to the substrate. After the air is discharged from the nozzle body, the treating solution is supplied to the substrate. Thus, the treating solution containing no bubbles is supplied to the substrate in a steady way. The treating solution is prevented from spilling to the substrate after completion of treating solution supply.

Preferably, part of the plurality of communicating passages are upper passages for communicating the upper ends of the discharge passages and an upper end of the trap. Any bubbles entering the trap from the discharge openings through the discharge passages and communicating passages will collect in the upper regions of the trap. Since part of the communicating passages are upper passages for communicating the upper ends of the discharge passages and the upper end of the trap, the bubbles collected in the upper regions of the trap may be released through the upper passages and discharge passages and out through the discharge openings. That is, the upper passages have a role of discharging both the treating solution and bubbles. This construction prevents supply of the treating solution with bubbles mixed therein, and spilling of the solution due to expansion of the bubbles after completion of the solution supply. Thus, a defective treatment due to mixing of bubbles may be avoided.

Preferably, the nozzle body includes a solution receiving portion continuous with the upper end of the trap, the upper passages being connected to positions of the trap adjacent the solution receiving portion. Bubbles entering the trap will tend to collect adjacent the solution receiving portion. Thus, the bubbles collected in the trap may be released easily through the upper passages connected to positions of the trap adjacent the solution receiving portion, and out through the discharge openings.

Preferably, the plurality of discharge openings are arranged in a row, the trap extending along a direction of arrangement of the discharge openings, the upper passages being connected to positions adjacent ends of the trap. Bubbles entering the trap will tend to collect adjacent the ends of the trap. Thus, the bubbles collected in the trap may be released easily through the upper passages connected to positions adjacent the ends of the trap, and out through the discharge openings.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 8A is a side view of a nozzle in the first embodiment;

FIG. 8B is a bottom view of the nozzle in the first embodiment;

FIG. 9 is a section taken on line B—B of FIG. 8A;

FIGS. 18A, 18B, 8C and 18D are views showing operation of the substrate developing apparatus in the second embodiment;

DESCRIPTION OF THE PREFERRED EMBODIMENTS

Preferred embodiments of the present invention will be described in detail hereinafter with reference to the drawings.

<First Embodiment>

Figure 1:
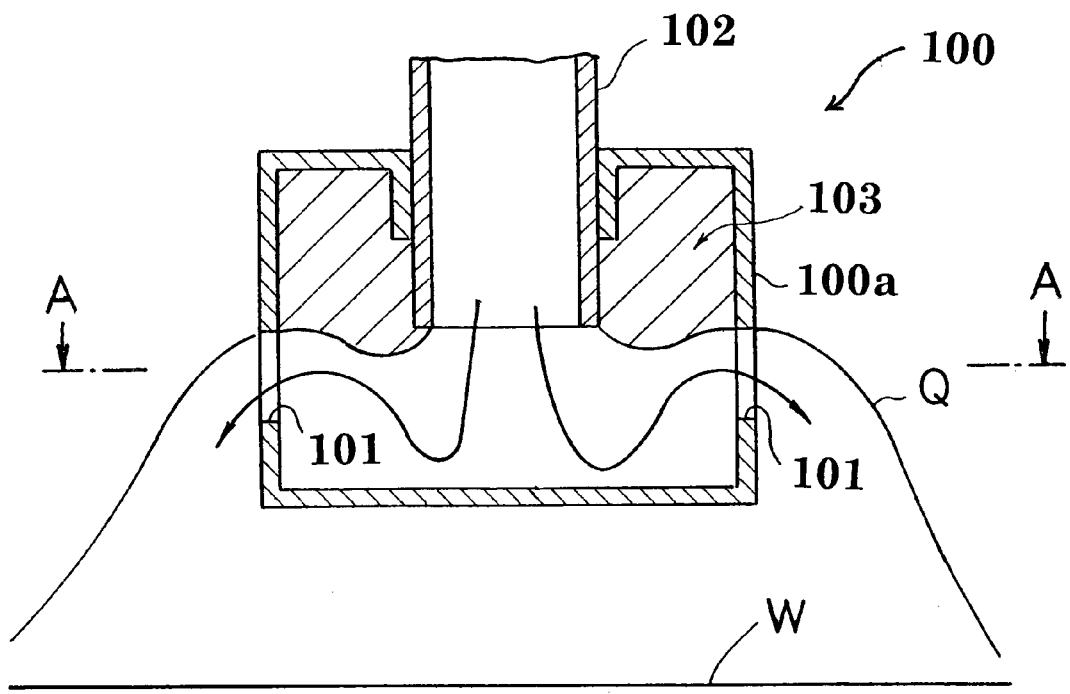
FIG. 1 is a view in vertical section of a developer discharge nozzle in a conventional substrate developing apparatus.
Figure 4:
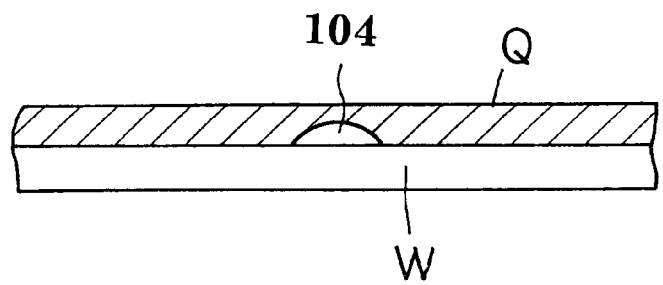
FIG. 4 is a view showing an influence of bubbles in the conventional developing process.
Figure 2:
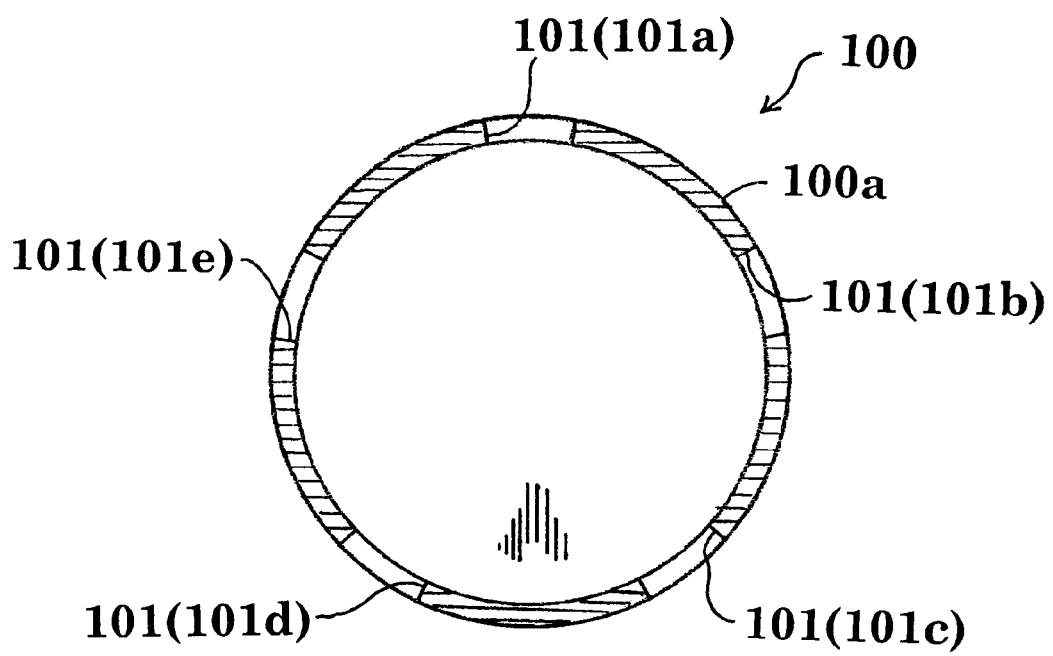
FIG. 2 is a section taken on line A—A of FIG. 1.
Figure 3:
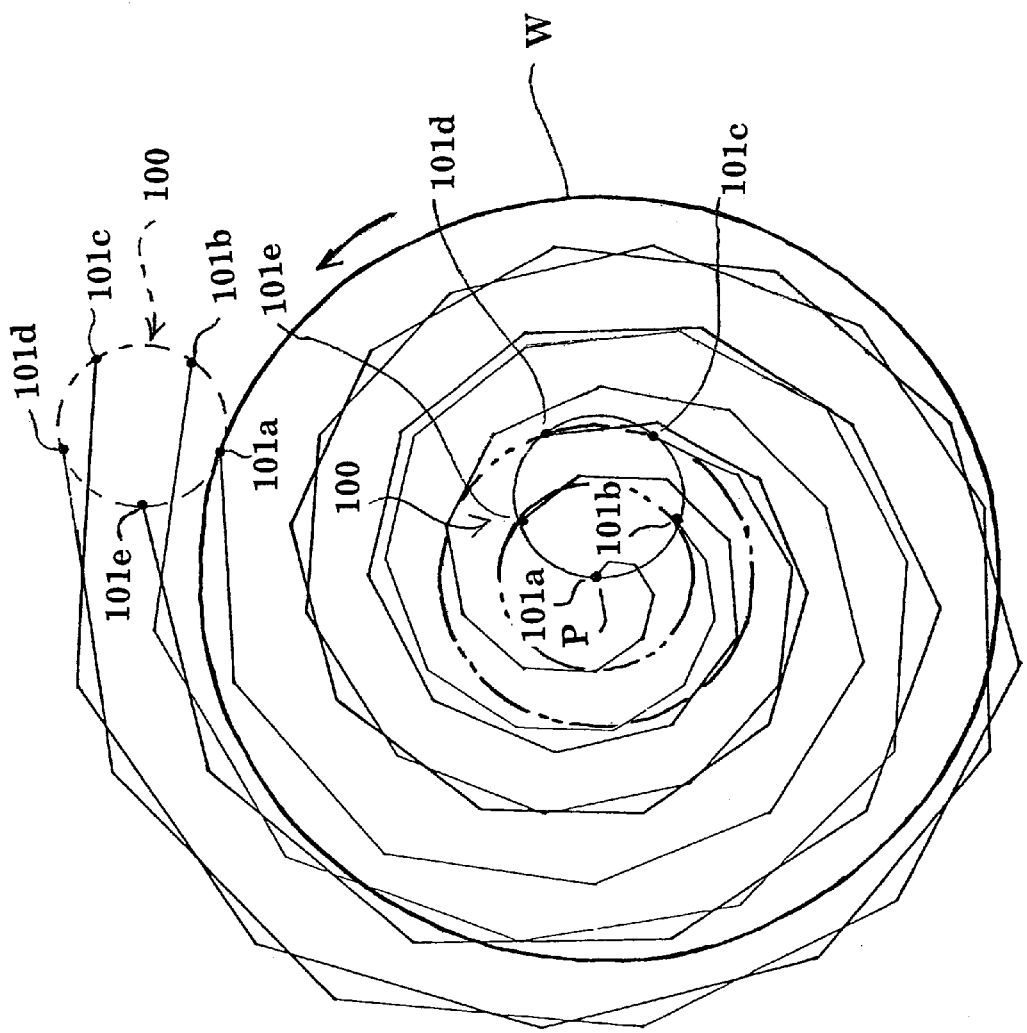
FIG. 3 is a view showing loci described by discharge openings in a conventional developing process.
Figure 5:
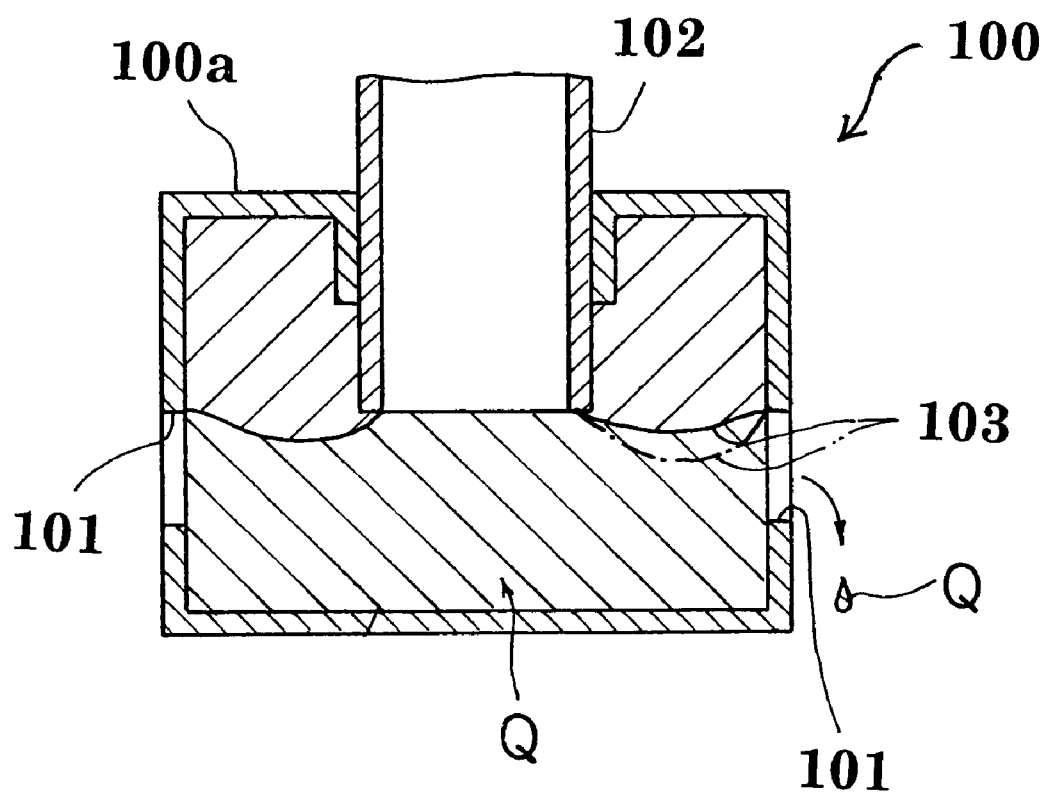
FIG. 5 is an explanatory view of a drawback of the conventional nozzle.
Figure 6:
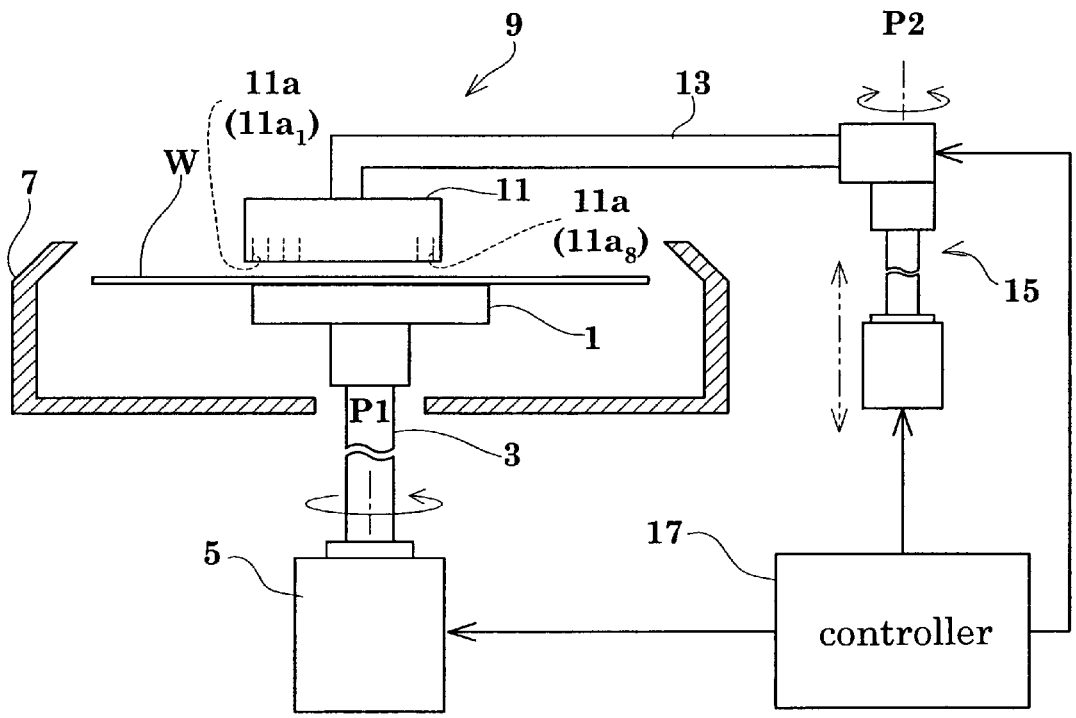
FIG. 6 is a schematic view of a substrate developing apparatus in a first embodiment of the present invention.
Figure 7:
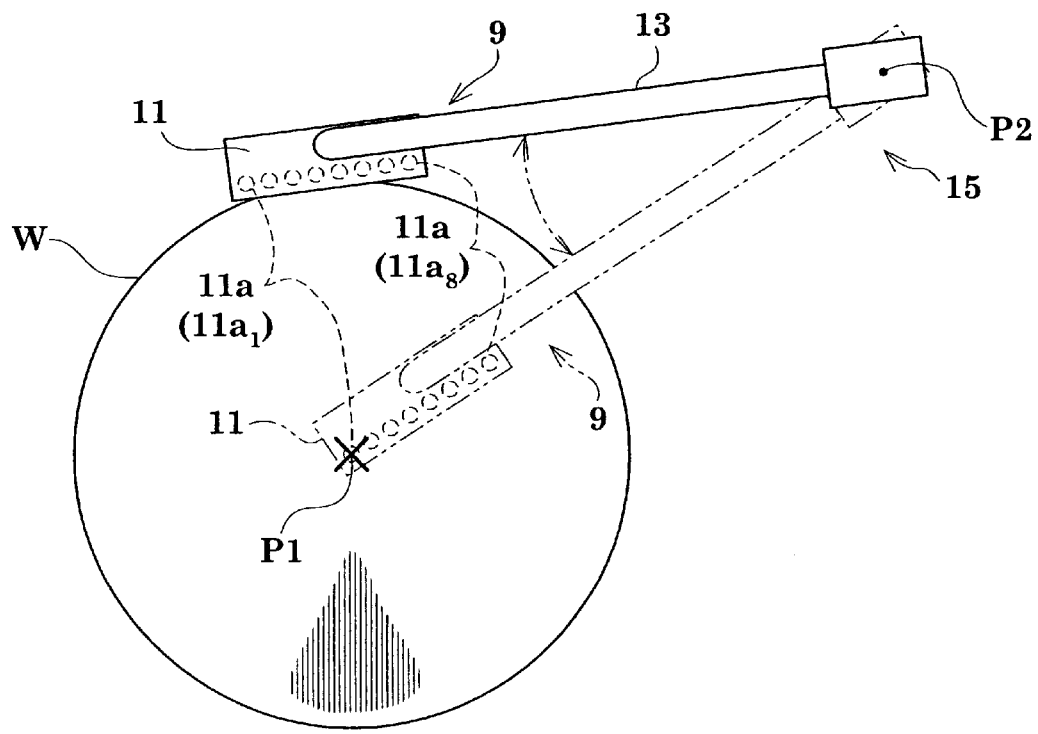
FIG. 7 is a plan view showing a nozzle movement.

FIG. 6 is a schematic view of a substrate treating apparatus, particularly a substrate developing apparatus, in a first embodiment. FIG. 7 is a plan view showing a nozzle movement.

A spin chuck 1 for supporting a wafer W in horizontal posture is operatively connected to an electric motor 5 through a rotary shaft 3. With rotation of the electric motor 5, the wafer W spins about a spin center PI. The spin chuck 1, rotary shaft 3 and electric motor 5 constitute the spin support device of the present invention.

The spin chuck 1 is surrounded by a scatter preventive cup 7 which prevents a developer supplied to the wafer W from scattering to the ambient. A developer discharge nozzle 9 is disposed above the spin chuck 1. This nozzle 9 corresponds to the treating solution supplying device of the invention. The nozzle 9 includes a nozzle body 11 and a support arm 13 supporting the nozzle body 11. The nozzle 9 is vertically movable with a swing mechanism 15 operatively connected to the proximal end of support arm 13. The swing mechanism 15 swings the support arm 13 about a pivotal axis P2 to move the nozzle body 11 radially of wafer W. The nozzle body 11 has eight discharge openings 11a formed and arranged linearly in a bottom surface thereof. With a swing of support arm 13, the foremost one (closest to the spin center P1) of the eight discharge openings 11a is movable over the spin center P1.

The electric motor 5, nozzle 9 and swing mechanism 15 are connected to a controller 17. The controller 17 controls rotational frequency, swing speed, and discharge timing and quantity of the developer in a coordinated way.

As shown in FIGS. 8A and 8B, the eight discharge openings 11a are formed and arranged linearly in a bottom surface of nozzle body 11. For convenience of description, the eight discharge openings 11a will be identified, where necessary, as the first discharge opening $11a_1$ to the eighth discharge opening $11a_8$ in the order of arrangement from left to right. Where such differentiation is unnecessary, the discharge openings 11a will be referred to as such. All the discharge openings 11a formed in the nozzle body 11 are in communication with a supply passage 13a formed in the support arm 13 for supplying the developer. The developer is discharged from all the discharge openings 11a at the same time. As shown in FIG. 9 which is a section taken on line B—B of FIG. 8A, the discharge openings 11a are in communication with the supply passage 13a through a trap 11b and inclined passages 11c formed in the nozzle body 11. This construction is effective to avoid inconveniences in discharge caused by reductions in sectional areas of the passages due to bubbles contained in the developer.

The controller 17 controls the rotational frequency of electric motor 5, the swing speed of swing mechanism 15, and discharge timing and quantity of the developer from the discharge openings 11a in a coordinated way. For example, while the electric motor 5 is rotated at a fixed speed and the developer is discharged from all the discharge openings 11a at the same time, and the nozzle body 11 of nozzle 9 is swung, as shown in FIG. 7, from a position (solid line in FIG. 7) laterally of wafer W to a position (two-dot chain line) above the spin center P1 of wafer W. The developer is thereby supplied over the entire surface of wafer W. As an alternative direction, the nozzle 9 may be swung from the spin center P1 to an edge of wafer W.

Figure 10:
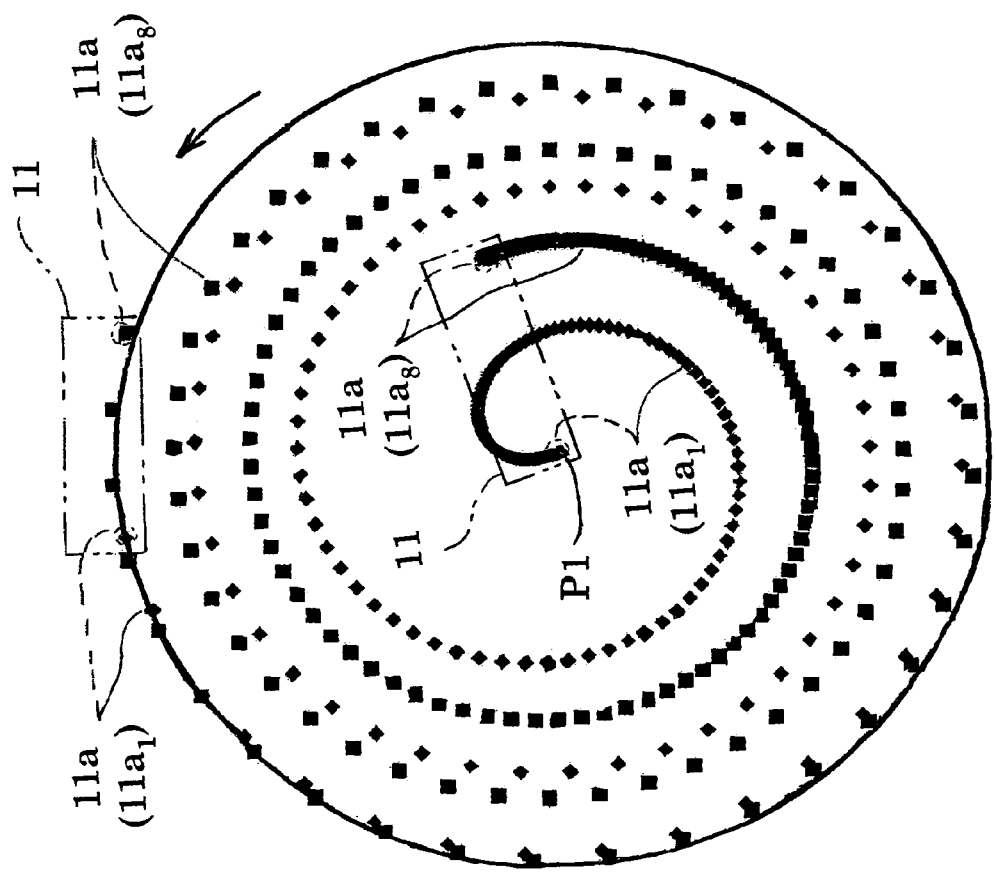
FIG. 10 is a plan view showing loci described by discharge openings of the nozzle in the first embodiment.

As seen from FIG. 7, the discharge openings 11a are at different distances from the spin center P1. Consequently, the first to eighth discharge openings $11a_1$–$11a_8$ describe loci over the wafer W as shown in FIG. 10, for example. For expediency of illustration, FIG. 10 depicts, in rhombus and square dots, only the loci of the first discharge opening $11a_1$ and eighth discharge opening $11a_8$ at opposite ends of the discharge openings 11a formed in the nozzle body 11.

As seen from FIG. 10, the first and eighth discharge openings $11a_1$ and $11a_8$ at the opposite ends of the eight discharge openings 11a formed in the linear arrangement describe the loci never overlapping each other. This fact applies also to the loci of the intermediate, second to seventh discharge openings $11a_2$–$11a_7$. Each of the eight discharge openings 11a, i.e. the first to eighth discharge openings $11a_1$–$11a_8$, formed in the nozzle body 11 does not describe the same locus as any other. As a result, the developer discharged does not concentrate on particular regions of wafer W. The developer is supplied uniformly over the entire surface of wafer W, without local concentration, by moving all the discharge openings 11a in unison radially of the spinning wafer W. Thus, a uniform developing treatment is effected over the surface of the wafer W.

Figure 11:
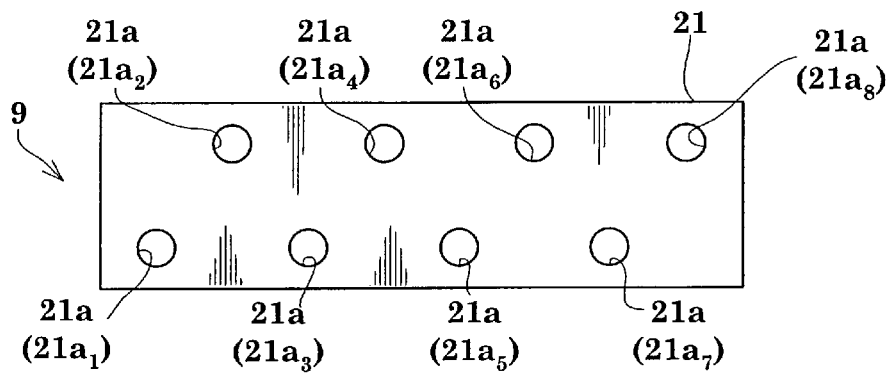
FIG. 11 is a bottom view of a modification of the nozzle in the first embodiment.

The above advantage is not limited to the foregoing nozzle body 11. A modified nozzle body 21 is shown in FIG. 11 (which shows a bottom view of the nozzle body).

The nozzle body 11 described hereinbefore has eight discharge openings 11a formed and arranged linearly in the bottom thereof. The modified nozzle body 21 has, in the bottom surface thereof, four discharge openings $21a_1$, $21a_3$, $21a_5$ and $21a_7$ arranged linearly, and four other discharge openings $21a_2$, $21a_4$, $21a_6$ and $21a_8$ arranged linearly and staggered with the first four openings. With this nozzle body 21 having two rows of discharge openings 21a arranged zigzag, the discharge openings 21a are at different distances from the spin center P1. This construction also is effective to prevent concentration of the developer to achieve the same effect as the construction described hereinbefore.

Figure 12:
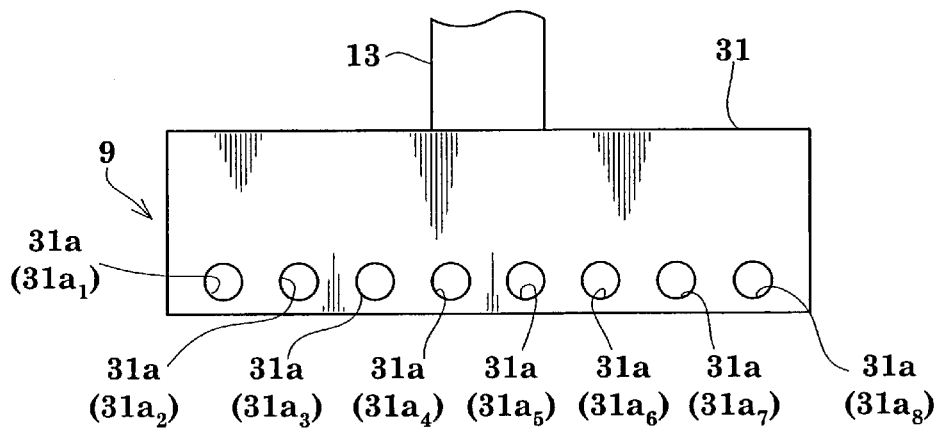
FIG. 12 is a side view of another modification of the nozzle in the first embodiment.

Another modified nozzle body 31, which produces a similar effect, is shown in side view in FIG. 12.

This nozzle body 31 has eight discharge openings 31a ($31a_1$–$31a_8$) formed laterally thereof. This construction also is effective to prevent concentration of the developer to assure a uniform developer supply to the wafer W.

Figure 13:
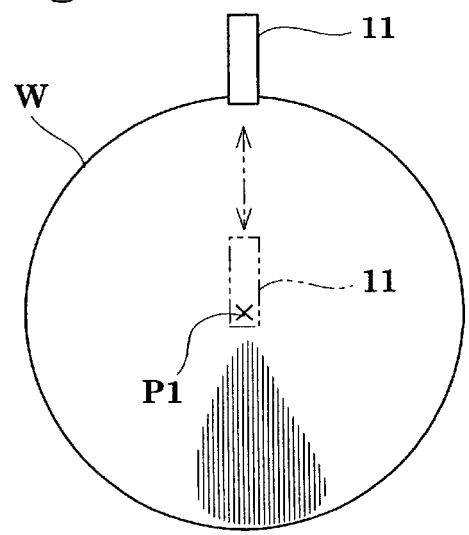
FIG. 13 is a plan view showing a modified movement of the nozzle in the first embodiment.

In the foregoing embodiment, the nozzle body 11 is swung radially of the wafer W. Alternatively, as shown in FIG. 13, the nozzle body 11 may be moved linearly radially of the wafer W.

In the foregoing description, the treating solution supplying device is exemplified by the nozzle body 11, 21 or 31 defining a plurality of discharge openings 11a, 21a or 31a. It is also in accordance with the invention to combine a plurality of nozzles each having one discharge opening. In this case, the nozzles are arranged such that the discharge openings are at different distances from the spin center of the wafer. All the nozzles are moved together radially of the wafer while discharging the developer at the same time.

<Second Embodiment>

Figure 14:
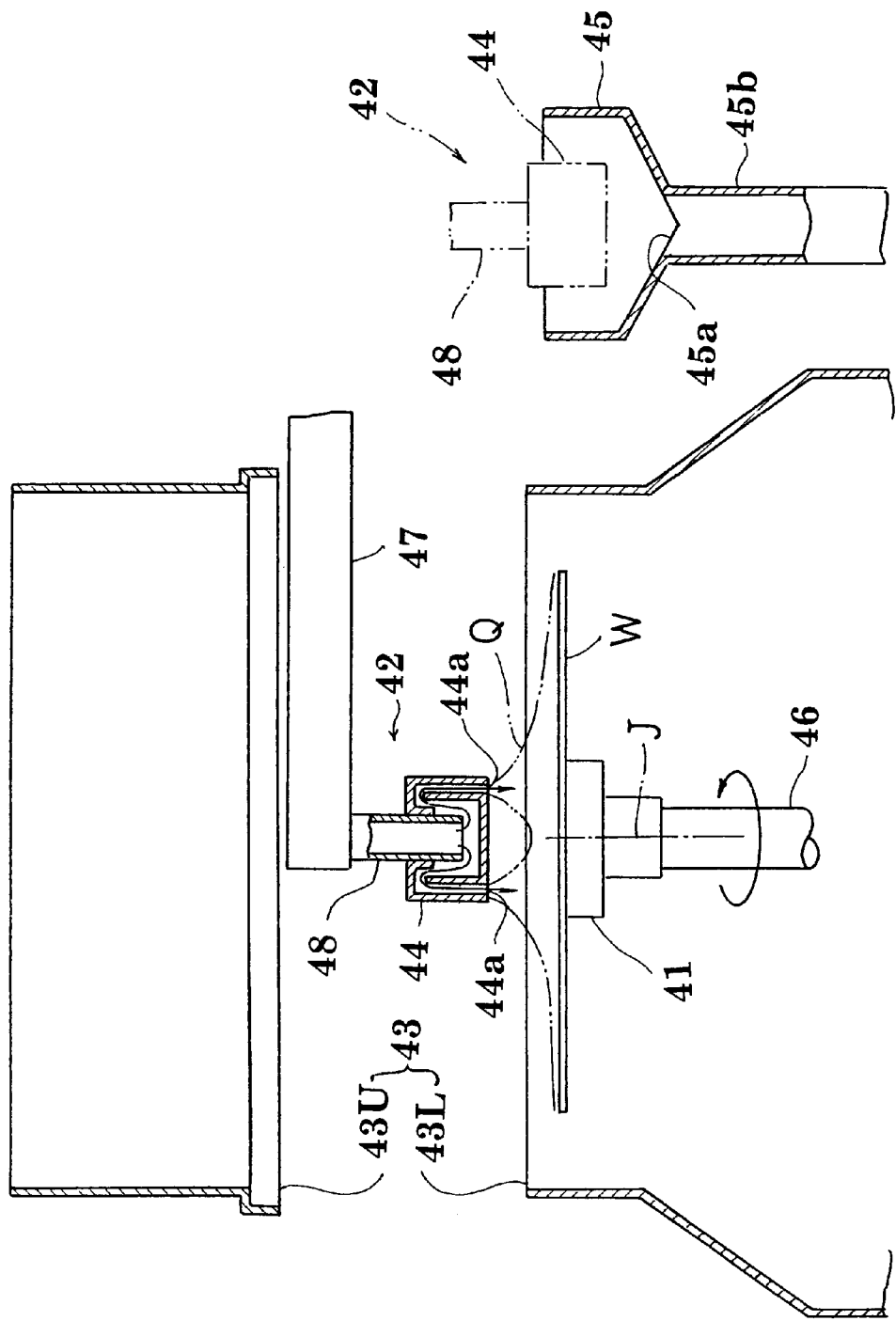
FIG. 14 is a schematic view in vertical section of a substrate developing apparatus in a second embodiment.

FIG. 14 is a schematic view in vertical section of a developing apparatus which is a substrate treating apparatus in a second embodiment of the invention.

This developing apparatus includes a spin chuck 41 for supporting a wafer W in horizontal posture and spinning it about a vertical axis J, a nozzle 42 acting as a treating solution supplying device for supplying a developer Q to the upper surface of wafer W supported in horizontal posture, a scatter preventive cup 43 for preventing scattering of developer Q and other treating solutions, a standby pot 45 disposed outside the scatter preventive cup 43 for receiving a nozzle body 44 of nozzle 42 on standby, and a nozzle moving mechanism (not shown) for moving the nozzle body 44 vertically and horizontally.

The spin chuck 41 is rotatable and vertically movable by a rotary shaft 46. The spin chuck 41 is raised to a predetermined upper position when transferring or receiving wafer W to/from a transport robot not shown, and lowered to a predetermined lower position after receiving wafer W from the transport robot. A developing process is performed while the spin chuck 41 stands still or rotates at low speed. A rinsing process following the developing process is performed while the spin chuck 41 spins at high speed.

The scatter preventive cup 43 includes an upper cup 43U and a lower cup 43L vertically separable from each other. The two cups 43U and 43L are vertically movable independently of each other by respective lift mechanisms (not shown).

The standby pot 45 includes a box-like member defining a space for accommodating the nozzle body 44 of nozzle 42 on standby, and a drain port 45a formed in the bottom. A drain 45b is connected to the drain port 45a. The developer Q discharged or dripped from discharge openings 44a of the nozzle body 44 in the standby pot 45 is drawn off through the drain 42.

The nozzle moving mechanism is operable to raise the nozzle body 44 on standby in the standby pot 45, and then move the nozzle body 44 horizontally to a supply position above the wafer W, and to move the nozzle body 44 horizontally from the supply position to a position above the standby pot 45, and then lower the nozzle body 44 into the standby pot 45. The nozzle moving mechanism raises and lowers the nozzle body 44 through a vertically movable support arm 47 supporting the nozzle body 44. The support arm 47 may be movable along a single horizontal axis, or extendible and retractable along the horizontal axis, or swingable about a vertical axis at a proximal end of support arm 47, to move the nozzle body 44 along the horizontal axis or swing the nozzle body 44 horizontally.

Figure 15:
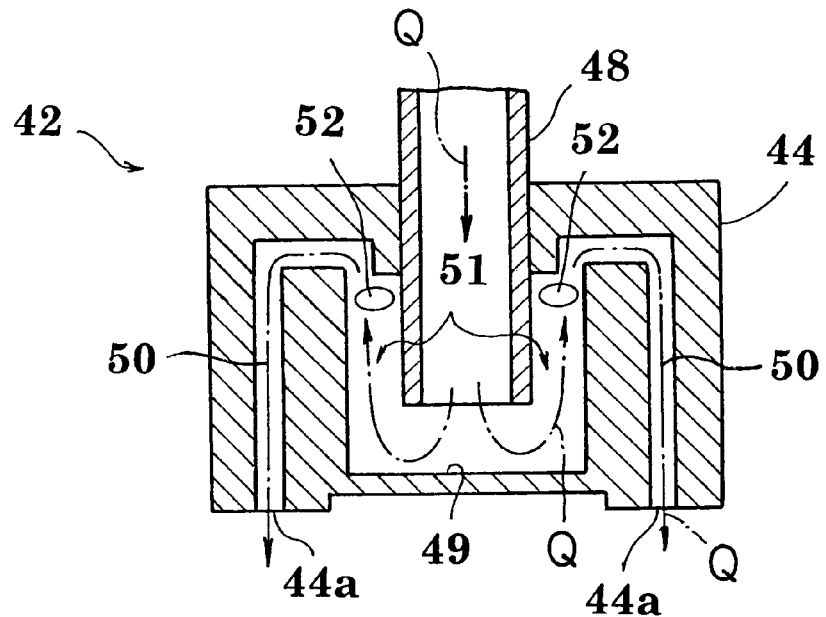
FIG. 15 is a sectional view of a nozzle in the second embodiment.
Figure 16:
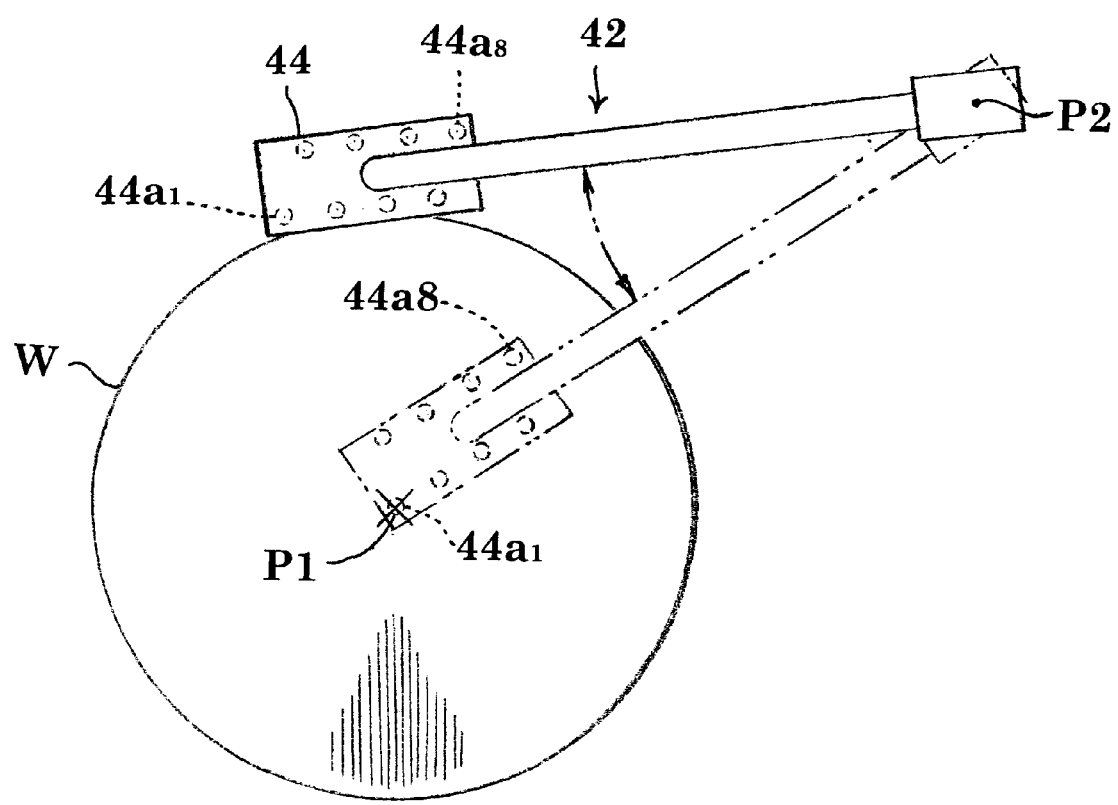
FIG. 16 is a plan view showing movement of the nozzle in the second embodiment.

Details of the nozzle 42 will be described next with reference to FIGS. 15 and 16.

The nozzle 42 includes a supply pipe 48 for supplying the developer Q, and the nozzle body 44 connected to a distal end of the supply pipe 48. The supply pipe 48 is supported to depend from a distal end of support arm 47. The supply pipe 48 is connected at a proximal end thereof to a developer source not shown. The developer Q is supplied from the developer source through the supply pipe 48 into the nozzle body 44.

The nozzle body 44 defines a trap 49 for storing the developer Q supplied from the distal end of supply pipe 48 down into the nozzle body 44, a plurality of discharge passages 50 extending upward from the respective discharge openings 44a, and communicating passages 51 for communicating the discharge passages 50 with the trap 49, respectively. The communicating passages 51 reverse the direction of flow of the developer Q supplied downward to the trap 49, and directs the developer Q to upper ends of the discharge passages 50. In the following description, the communicating passages 51 will be referred to as reversing passages 51. The plurality of discharge openings 44a formed in the bottom of nozzle body 44 are arranged in two rows and in a staggered relationship as those formed in the nozzle body 21 illustrated in FIG. 11. As shown in FIG. 16, the discharge openings 44a (first to eighth discharge openings $44a_1$–$44a_8$) are arranged to have different distances from the spin center P1 of wafer W. When the nozzle 42 is swung about an axis P2 to move the nozzle body 44 radially of wafer W, the first discharge opening 44a1 moves over the spin center P1 of wafer W.

With this nozzle 42, the developer Q supplied from the distal end of supply pipe 48 to the trap 49 inside the nozzle body 44 is reversed through the reversing passages 51 to flow into the upper ends of discharge passages 50. The developer Q then flows down the discharge passages 50 to the discharge openings 44a to be discharged therefrom at the same time.

In the nozzle body 44, air 52 has a tendency to remain in upper regions of reversing passages 51. From these upper regions of reversing passages 51, the developer Q flows into the discharge passages 50 leading to the discharge openings 44a. The direction of its flow is changed from upward to downward for discharge from the discharge opening 44a. The air 52 in the upper regions of reversing passages 51 is discharged along with developer Q from the discharge openings 44a. Thus, the nozzle 42 is constructed to prohibit air to remain inside. With this nozzle body 44, air entering through the discharge openings 44a, if any, cannot proceed beyond the discharge passages 50, and will be forced out with a next discharge of the treating solution.

An operation to purge air 52 along with the developer Q from the nozzle body 44 by supplying the developer Q from the distal end of supply pipe 48 into the nozzle body 44 and discharging the developer Q from the discharge openings 44a, as noted above, is carried out when the nozzle body 44 stands by in the standby pot 45. That is, the above operation is carried out when the discharge openings 44a of nozzle body 44 are displaced laterally from the wafer W. Consequently, the air 52 may be discharged with the developer Q from the nozzle body 44, instead of supplying the developer Q containing the air 52 (bubbles) to the wafer W.

Figure 17:
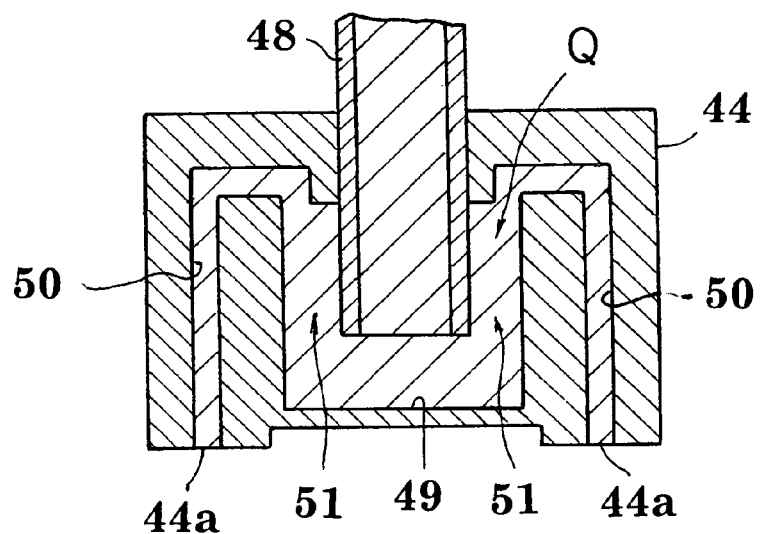
FIG. 17 is a sectional view of the nozzle, with a nozzle body purged of air, in the second embodiment.

After the air 52 is discharged from the nozzle body 44, the nozzle body 44 is filled with the developer Q as shown in FIG. 17. In this state, the nozzle body 44 is moved from the standby position in the standby pot 45 to the supply position above the wafer W. Then, the developer Q is supplied from the distal end of supply pipe 48 into the nozzle body 44 and delivered from the discharge openings 44a to the upper surface of wafer W for developing treatment. With no air collected in the nozzle body 44, the developer Q is supplied steadily from the discharge openings 44a to the upper surface of wafer W. The developer Q supplied to the upper surface of wafer W contains no bubbles. When the developer Q has been supplied in a predetermined quantity to the upper surface of wafer W, the developer Q is stopped being supplied from the supply pipe 48 into the nozzle body 44. Consequently, the supply of developer Q to the wafer W is stopped, with the developer Q filling the nozzle body 44 as shown in FIG. 17. Since air does not collect in the nozzle body 44, the developer Q in the nozzle body 44 does not drip to the wafer W after the developer supply is stopped. After finishing the supply of developer Q to the wafer W, the nozzle body 44 is moved from the supply position to the standby pot 45.

Each reversing passage 51 has a 6mm inside diameter, while each discharge passage 50 has a 1 to 3 mm, preferably 1.5 to 2.5 mm, inside diameter. With the discharge passages 50 formed thinner than the reversing passages 51 as above, air may be discharged smoothly with the treating solution. Further, with the thin discharge passages 50, the developer Q has strong surface tension inside the discharge passages 50. The strong surface tension prevents, with increased reliability, the developer Q in the nozzle body 44 from dripping from the discharge openings 44a to the wafer W when the nozzle body 44 is moved from the standby pot 45 to the supply position or from the supply position to the standby pot 45.

An operation of the above developing apparatus will be described next with reference to FIGS. 18A through 18D.

Figure 18A:
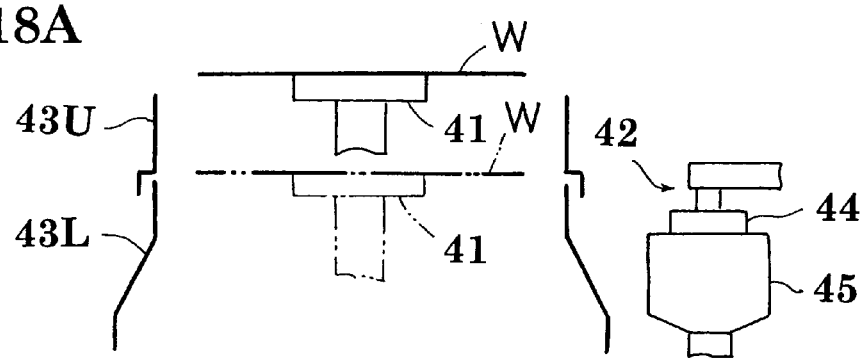

FIG. 18A shows the spin chuck 41 raised to the upper position for transferring or receiving wafer W to/from the transport robot. At this time, the nozzle body 44 stands by in the standby pot 45. The spin chuck 41 having received wafer W from the transport robot is lowered to the lower position shown in two-dot chain lines.

Figure 18B:
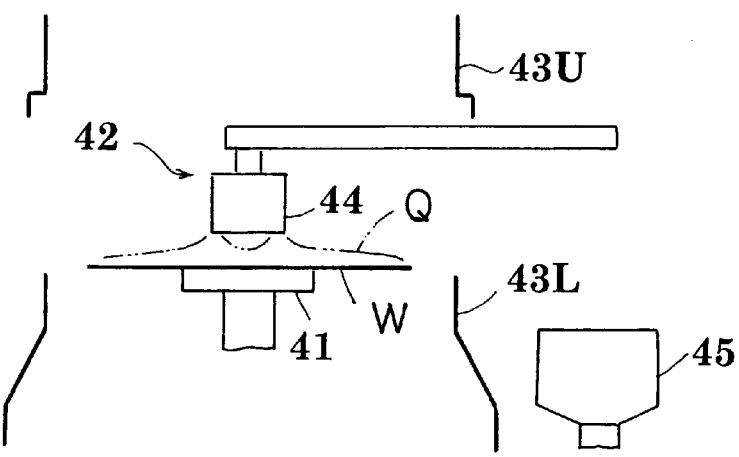

FIG. 18B shows the upper cup 43U raised to a predetermined height, the nozzle body 44 moved from the standby pot 45 to the supply position, and the developer Q supplied to the upper surface of wafer W. At this time, the spin chuck 41 stands still or rotates at low speed. As described hereinbefore, air is purged from the nozzle body 44 while the nozzle body 44 is on standby in the standby pot 45, before supplying the developer Q to the wafer W.

As described with reference to FIG. 16, the discharge openings $44a_1$–$44a_8$ are at different distances from the spin center P1 of wafer W, and describe loci never overlapping one another. Consequently, the developer discharged is prevented from concentrating on particular regions of wafer W. The developer is supplied uniformly over the entire surface of wafer W, without local concentration, by moving all the discharge openings $44a_1$–$44a_8$ in unison radially of the spinning wafer W. As a result, a uniform developing treatment is effected over the surface of the wafer W.

Before supplying the developer Q to the wafer W, a dust purging operation by spraying nitrogen gas, prewetting with a diluted solution of the developer, and other operations, may be carried out as appropriate. After finishing the supply of developer Q to the wafer W, the nozzle body 44 is moved to the standby pot 45 to stand by therein.

Figure 18C:
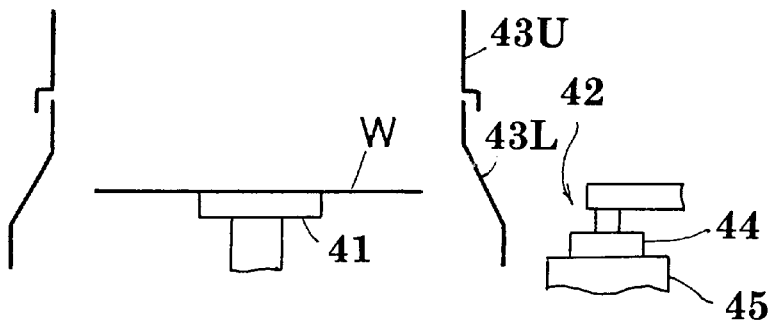

FIG. 18C shows the lower cup 43L raised from the position shown in FIG. 18B to a position where an inclined surface of lower cup 43L is level with a substrate supporting surface of spin chuck 41. In this state, the spin chuck 41 stands still for an appropriate developing time (e.g. 30–80 seconds). Next, while the spin chuck 41 is spun at high speed, a rinsing liquid (deionized water) is supplied from nozzles, not shown, to the upper surface of wafer W to wash away the developer.

Figure 18D:
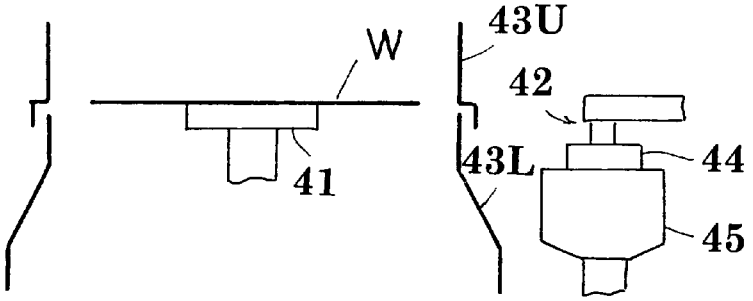

FIG. 18D shows the upper cup 43U and lower cup 43L lowered together to an operation ending position. Then, as shown in FIG. 18A, the spin chuck 41 is raised to the upper position to transfer the wafer W having undergone the developing process to the transport robot and to receive a next wafer W from the transport robot. By repeating the series of steps illustrated in FIGS. 18A through 18D, the developing process is performed for successive wafers W.

The operation to discharge air from the nozzle body 44 may be carried out prior to the developing process of each wafer W. However, after one such operation, the nozzle body 44 remains filled with the developer not including air. Thus, the operation to discharge air from the nozzle body 44 may be carried out after the developing process for every predetermined number of wafers W, for example.

Figure 19A:
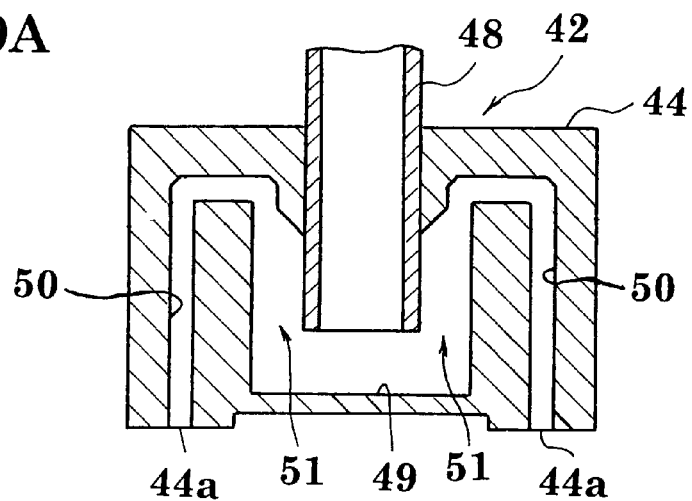
FIGS. 19A, 19B and 19C are sectional views of principal portions of modifications of the nozzle in the second embodiment.
Figure 19B:
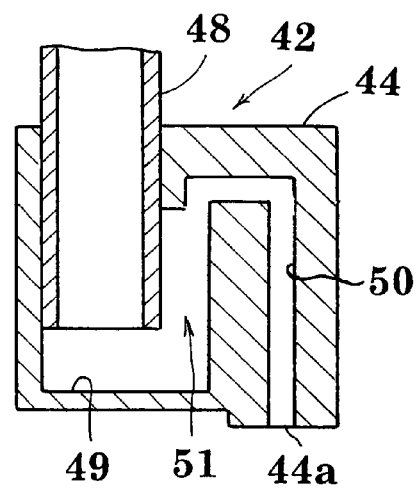
Figure 19C:
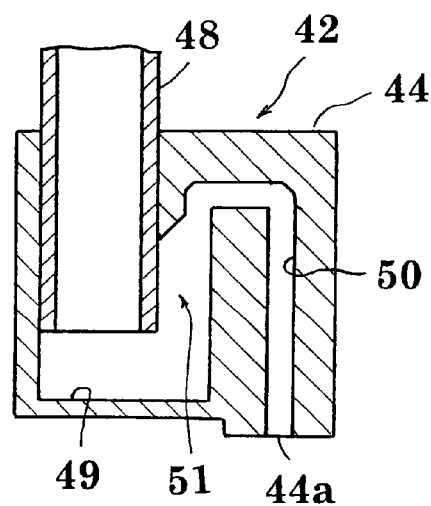

FIGS. 19A through 19C are sectional views of principal portions of modified nozzles 42.

In FIGS. 19A and 19C, corners in the upper regions of reversing passages 51 and corners in the discharge passages 50 are tapered. Such constructions assure a reliable discharge of air from the nozzle body 44. In FIGS. 19B and 19C, the reversing passages 51, discharge passages 50 and discharge openings 26 are arranged at only one side (the right side in the drawings) of the supply pipe 48.

<Third Embodiment>

Figure 20:
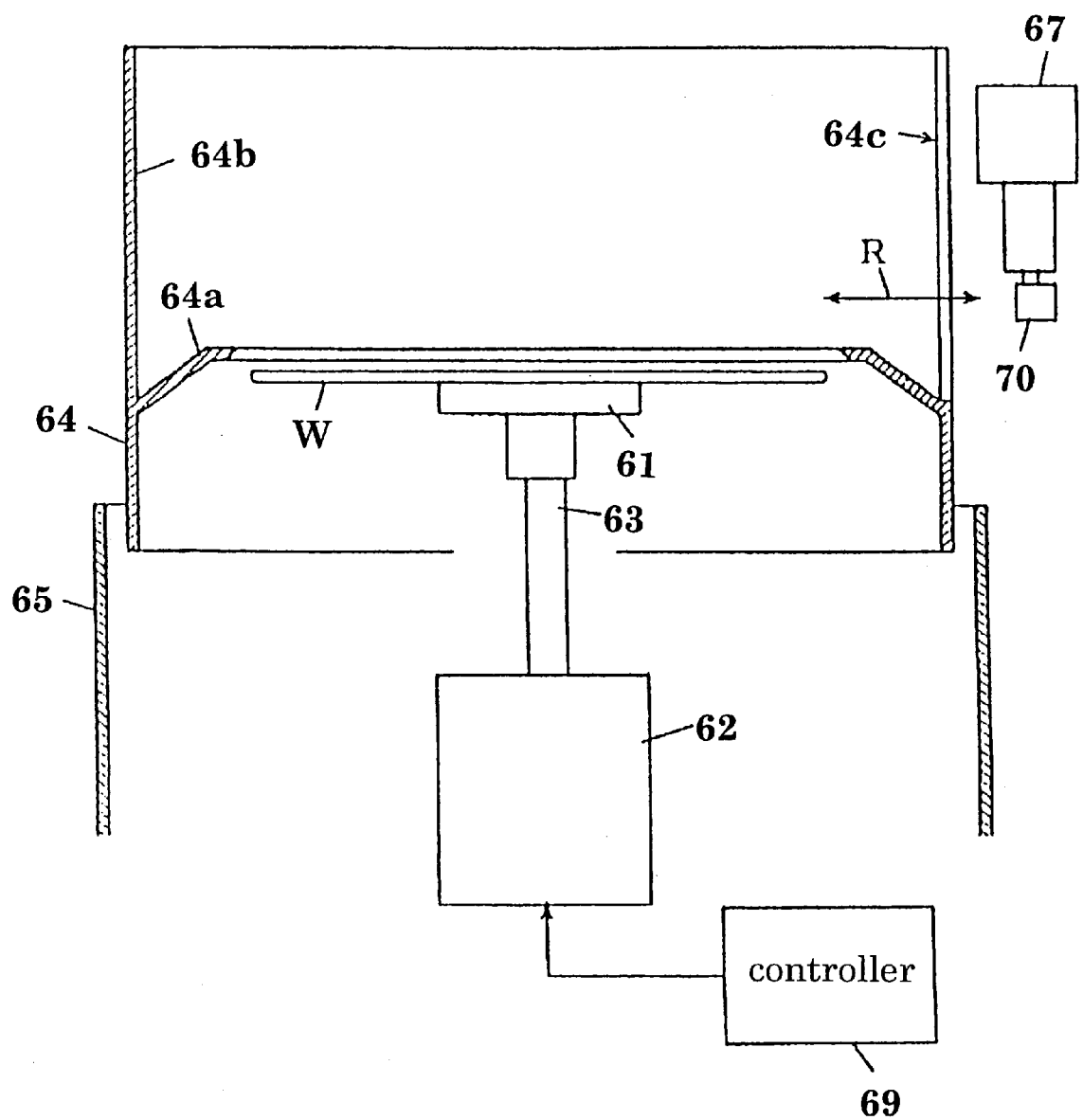
FIG. 20 is a sectional view of a principal portion of a substrate developing apparatus in a third embodiment.
Figure 21:
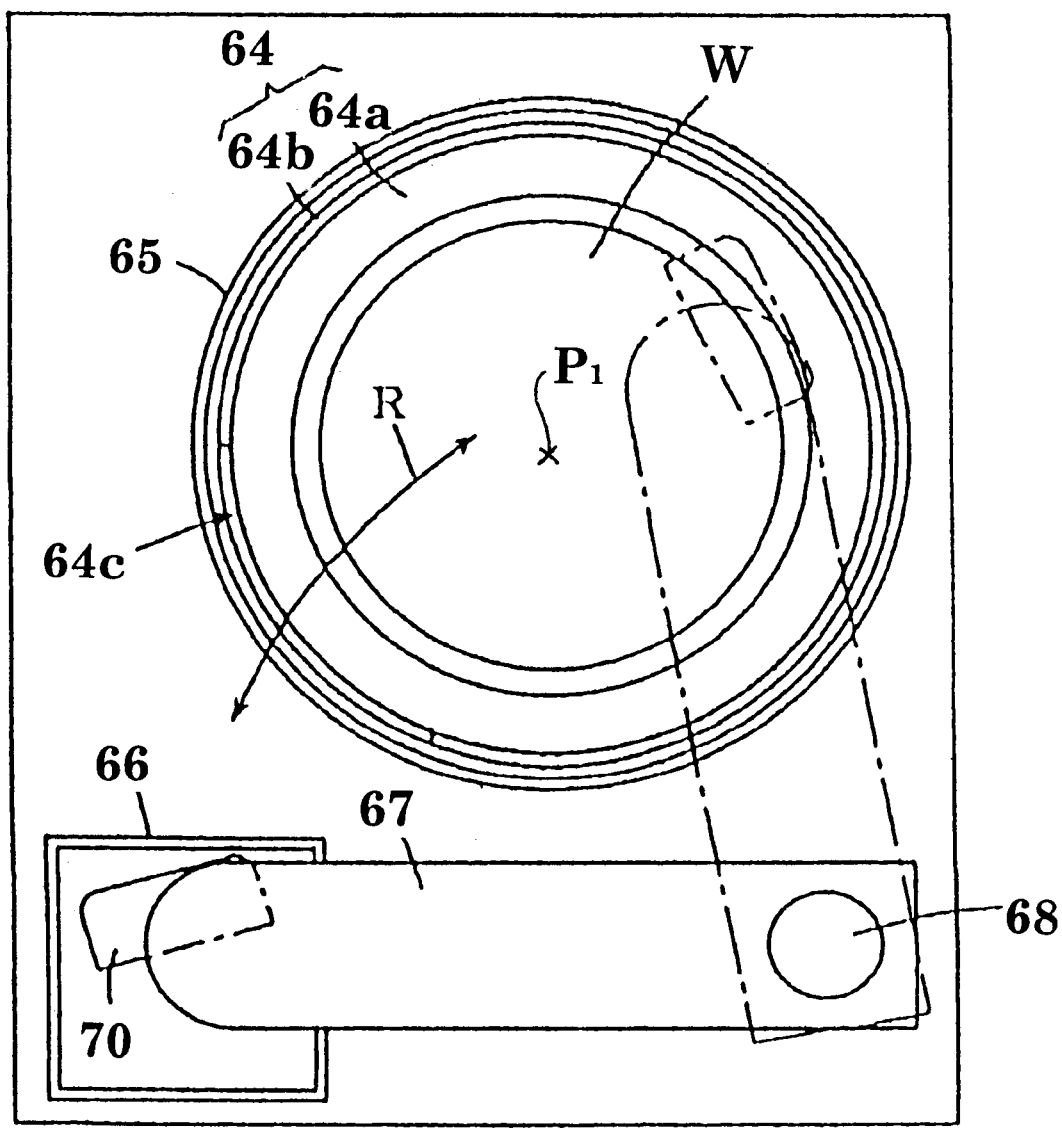
FIG. 21 is a plan view of the substrate developing apparatus in the third embodiment.

FIG. 20 is a sectional view of a principal portion of a substrate developing apparatus in a third embodiment. FIG. 21 is a plan view of the substrate developing apparatus of FIG. 20.

As shown in FIG. 20, the substrate developing apparatus includes a spin chuck 61 for suction-supporting a wafer W in horizontal posture. The spin chuck 61 is fixed to an upper end of a rotary shaft 63 of a motor 62 to be rotatable about a vertical axis.

Solution scatter preventive cups 64 and 65 are disposed around the spin chuck 61 to surround the wafer W. The cup 65 is fixed whereas the cup 64 is vertically movable by a cup driver (not shown). The cup 64 includes a tapered portion 64a inclined inwardly, and a cylindrical splash guard 64b extending around an outer area above the tapered portion 64a.

As shown in FIG. 21, a standby pot 66 is disposed in a standby position outside the cup 64. A support arm 67 is provided to be swingable in a horizontal plane by an arm driver 68. A developer discharge nozzle 70 is attached to a lower surface at a distal end of support arm 67. With swinging of the support arm 67, as indicated by an arrow R, the nozzle 70 is movable between a position over the wafer W inside the cup 64 and a position in the standby pot 66.

To allow passage of the nozzle 70, the splash guard 64a has a cutout 64c formed in a portion thereof coinciding with a moving track of nozzle 70. The nozzle 70 receives a developer supplied as a treating solution from a developer supply system (not shown).

FIG. 20 shows a controller 69 which controls rotation of motor 62, movement of nozzle 70 through the arm driver 68, discharge of the developer from the nozzle 70, and vertical movement of cup 64 through the cup driver.

To effect developing treatment, the wafer W is spun by the motor 62, and the nozzle 70 is moved, while discharging the developer, from a position between the outer edge of wafer W and the tapered portion 64a of cup 64 to the center of spinning wafer W.

Figure 22A:
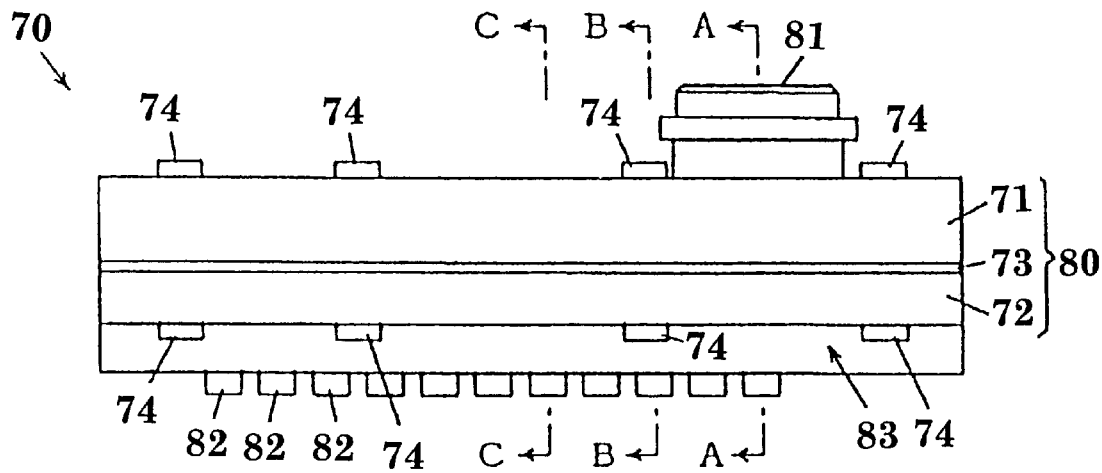
FIGS. 22A, 22B and 22C are a front view, a bottom view and a side view, respectively, of a nozzle in the third embodiment.
Figure 22B:
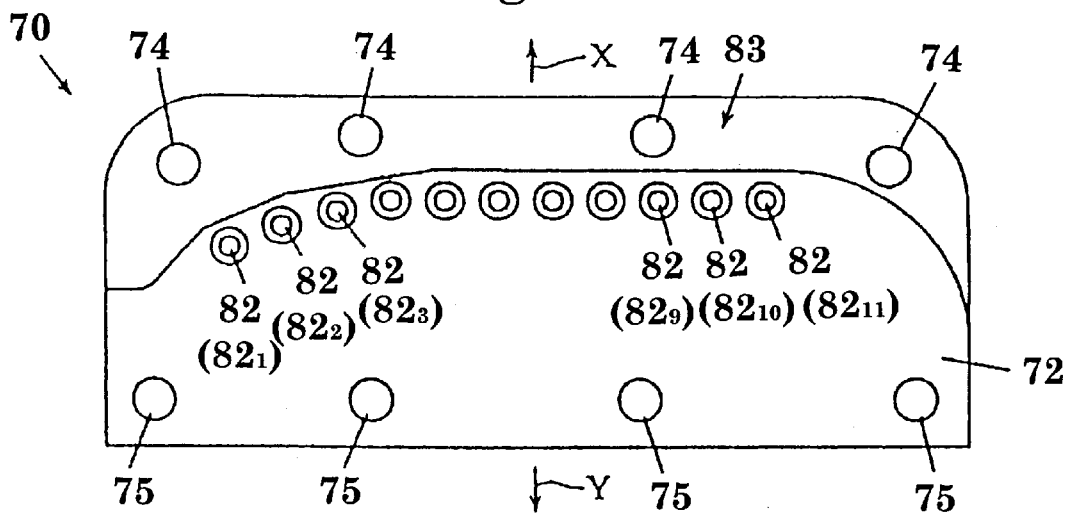
Figure 22C:
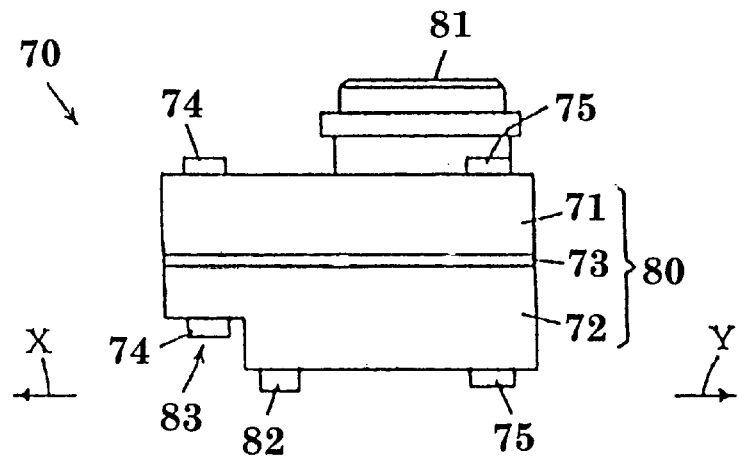
Figure 23A:
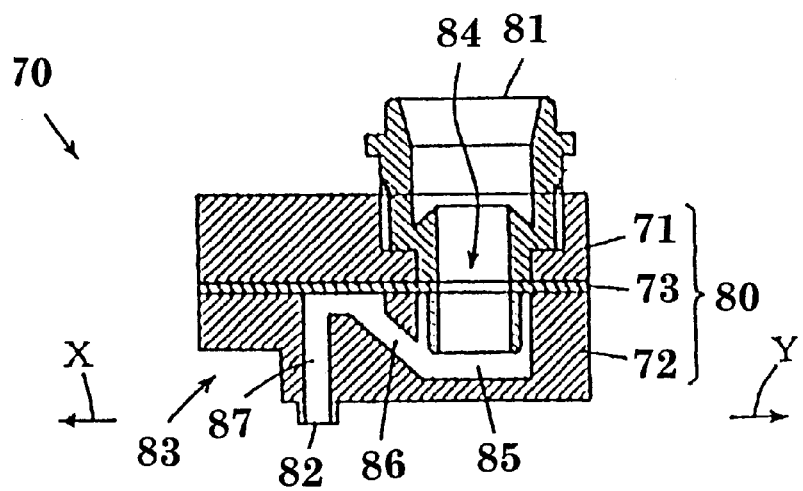
FIGS. 23A, 23B and 23C are sections taken on lines A—A, B—B and C—C, respectively, of FIG. 22A.
Figure 23B:
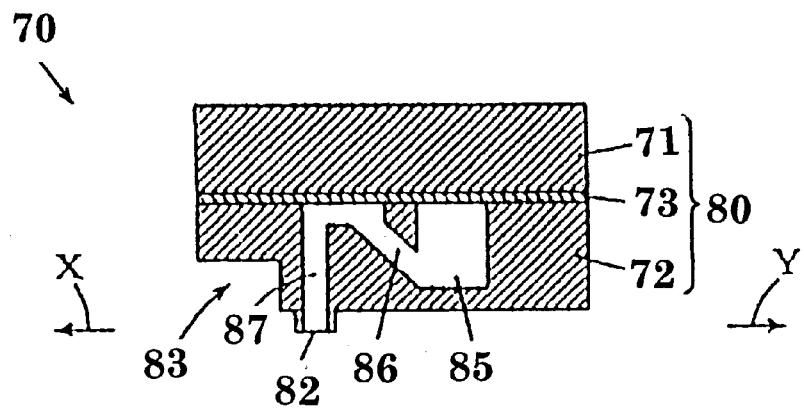
Figure 23C:
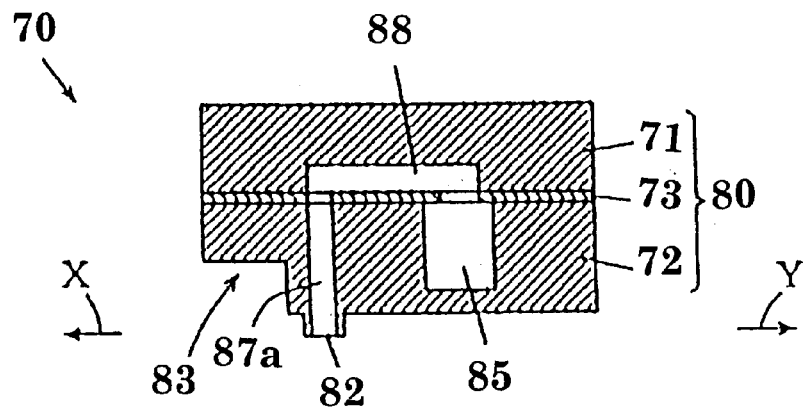
Figure 24A:
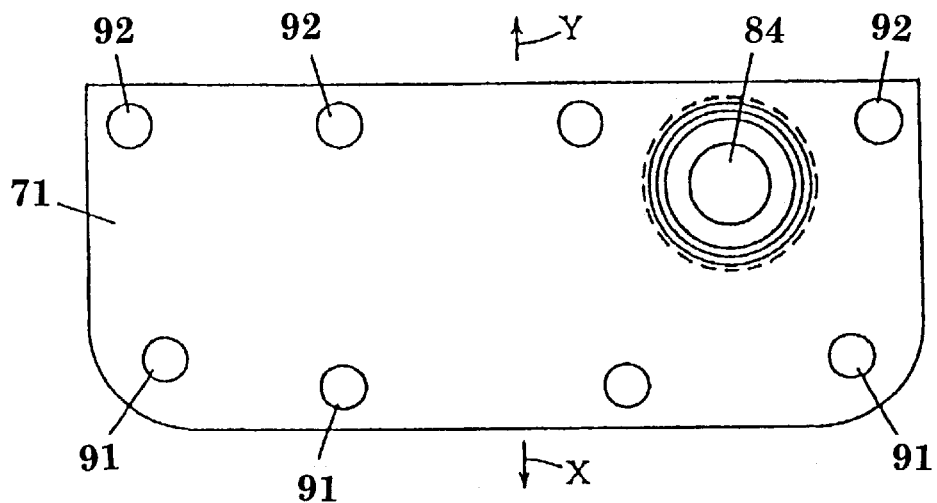
FIGS. 24A, 24B, 24C and 24D are a plan view, a front view, a bottom view and a section taken on line D—D, respectively, of an upper member of the nozzle in the third embodiment.
Figure 24B:
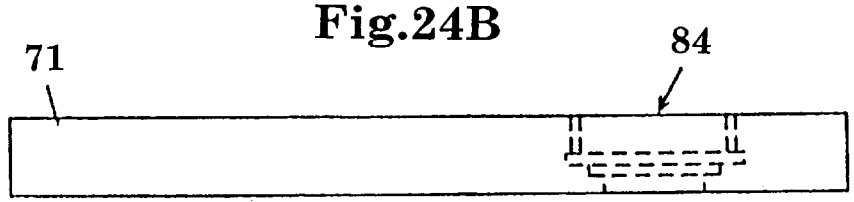
Figure 24C:
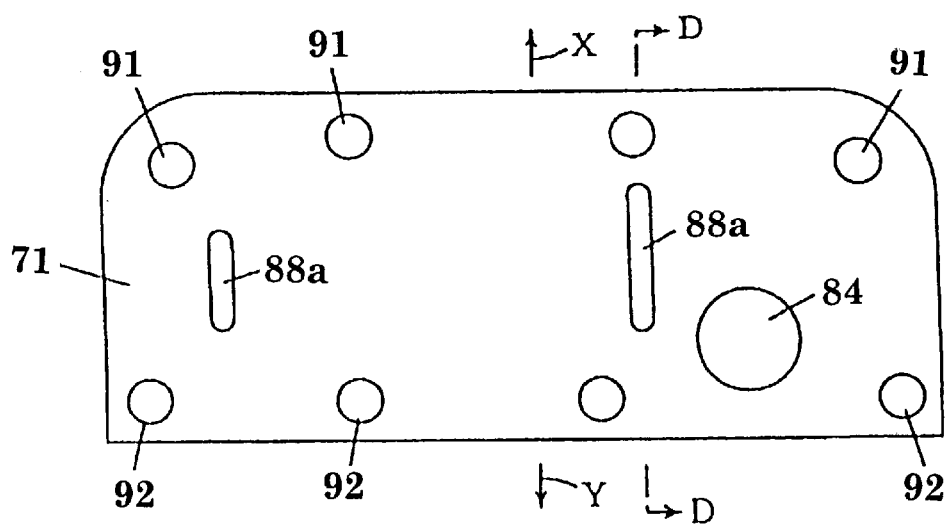
Figure 24D:
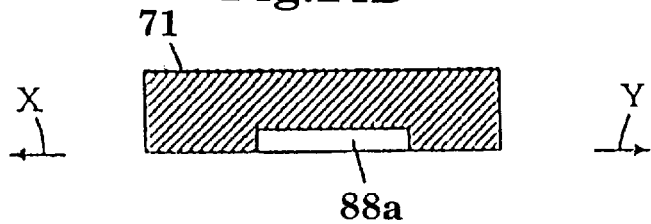
Figure 25A:
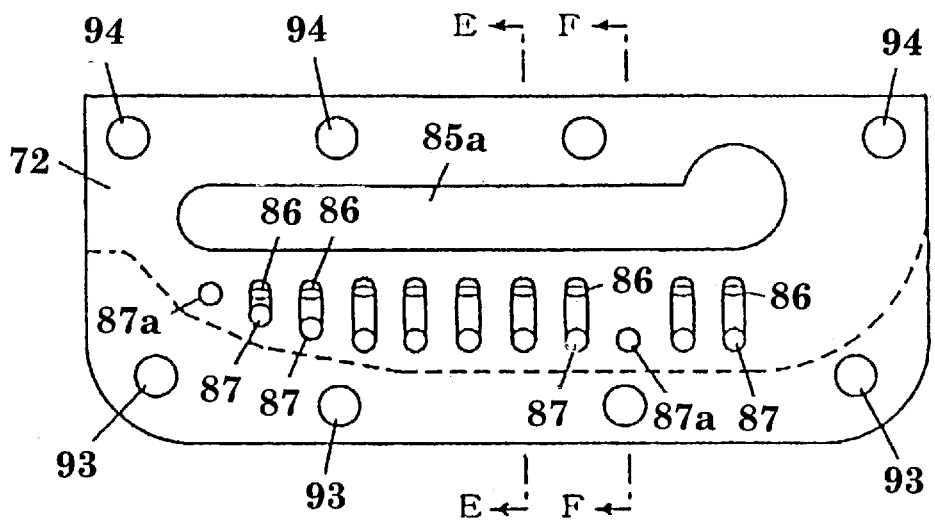
FIGS. 25A, 25B, 25C, 25D and 25E are a plan view, a front view, a bottom view, a section taken on line E—E and a section taken on line F—F, respectively, of a lower member of the nozzle in the third embodiment.
Figure 25B:
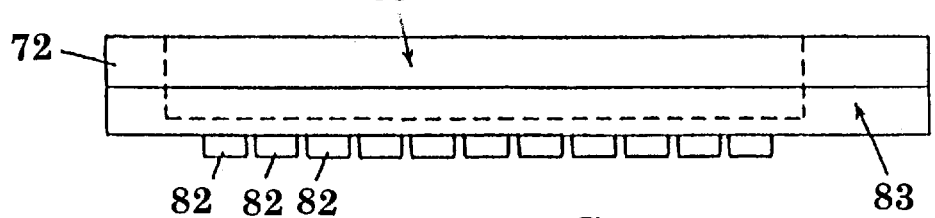
Figure 25C:
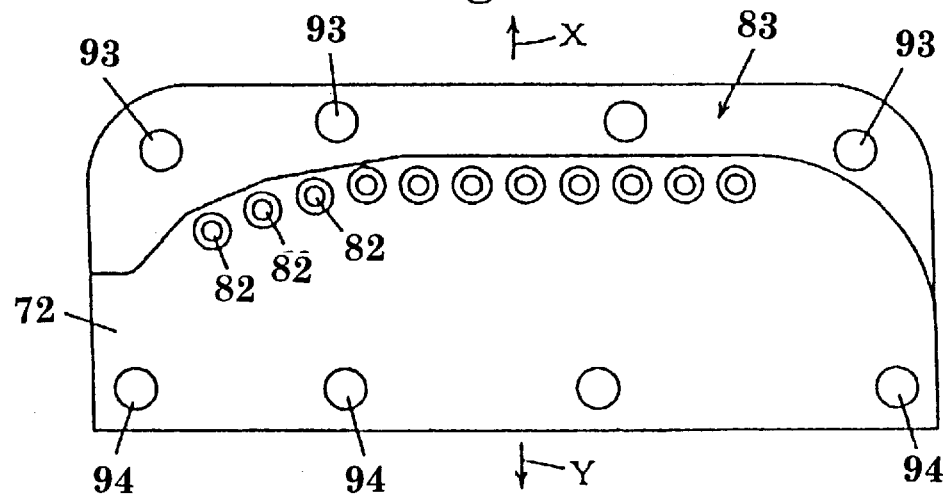
Figure 25D:
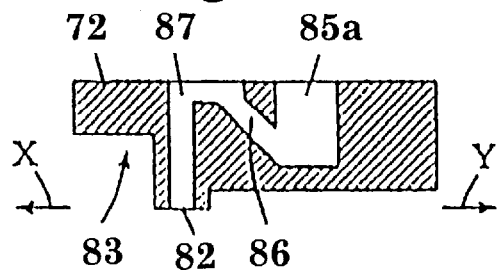
Figure 25E:
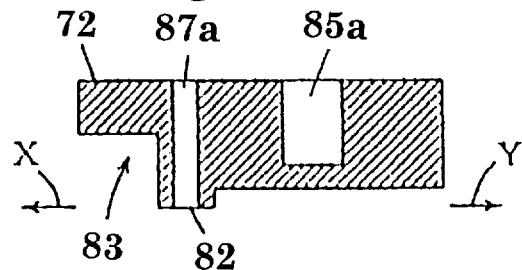

FIGS. 22A through 22C are a front view, a bottom view and a side view, respectively, of the nozzle 70. FIGS. 23A through 23C are sections taken on lines A—A, B—B and C—C, respectively, of FIG. 22A.

In these drawings, the nozzle 70 lies between the outer edge of wafer W and an inner edge of the tapered portion 64a of cup 64, wherein an arrow X points to the cup 64 and an arrow Y to the wafer W.

As shown in FIGS. 22A through 22C, the nozzle 70 includes an upper member 71 and a lower member 72 joined together by bolts 74 and 75, with a sheet packing 73 disposed in between. These upper member 71, lower member 72 and sheet packing 73 constitute a nozzle body 80.

The nozzle body 80 has a solution inlet 81 formed in an upper surface thereof, and a plurality of discharge openings 82 (first to eleventh discharge openings $82_1$–$82_{11}$) formed in a lower surface. At least part of the discharge openings 82 (e.g. the first to third discharge openings $82_1$–$82_3$) are arranged arcuately to follow the outer edge of wafer W. The discharge openings 82 are arranged in a row as a whole, and are at different distances from the spin center P1 of wafer W. When the nozzle body 80 is swung radially of wafer W, the first discharge opening $82_1$ is movable over the spin center P1 of wafer W. When the nozzle body 80 is swung radially of wafer W in a spin, the discharge openings 82 describe loci never overlapping one another. Consequently, the developer discharged is prevented from concentrating on particular regions of wafer W. The developer is supplied uniformly over the entire surface of wafer W.

The lower member 72 has a cutout recess 83 formed in a lower surface thereof and extending along an edge opposed to the cup 64. Thus, the nozzle body 80 has a stepped bottom surface such that the nozzle body 80 is thinner in a portion thereof opposed to the cup 64 than in the remaining portion including the discharge openings 82.

As shown in FIG. 23A, the upper member 71 has a solution receiving portion 84 formed adjacent one end thereof for receiving the developer from the solution inlet 81. As shown in FIGS. 23A through 23C, the lower member 72 defines a trap 85 extending from adjacent one end toward the other end thereof, and tubular discharge passages 87 and 87a extending upward from the respective discharge openings 82.

As shown in FIG. 23C in particular, upper ends of part of the discharge passages 87a communicate with an upper end of trap 85 through tubular upper passages 88 formed in the upper member 71. As shown in FIGS. 23A and 23B, upper ends of the remaining discharge passages 87 communicate a lower end of trap 85 through tubular inclined passages 86 extending obliquely downward. In this embodiment, two discharge passages 87a communicate with the trap 85 through the upper passages 88.

FIGS. 24A through 24D are a plan view, a front view, a bottom view and a section taken on line D—D, respectively, of the upper member 71 of nozzle 70.

As shown in FIGS. 24A through 24D, the solution receiving portion 84 extends vertically through the upper member 71. The upper member 71 has two grooves 88a formed in a lower surface thereof and defining the upper passages 88. Further, the upper member 71 defines a plurality of threaded bores 91 arranged along an edge thereof opposed to the cup 64 for receiving the bolts 74, and a plurality of threaded bores 92 arranged along an edge thereof opposed to the wafer W for receiving the bolts 75.

FIGS. 25A through 25E are a plan view, a front view, a bottom view, a section taken on line E–E and a section taken on line F–F, respectively, of the lower member 72 of nozzle 70.

As shown in FIGS. 25A through 25E, the lower member 72 has a recess 85a formed in the upper surface thereof and defining the trap 85. The plurality of discharge openings 82 also are formed in the lower surface of lower member 72. Further, the plurality of discharge passages 87 and 87a extend from the discharge openings 82 to the upper surface of lower member 72. The lower member 72 has the inclined passages 86 extending from the discharge passages 87 except the two discharge passages 87a to the bottom of recess 85a. The cutout recess 83 is formed in the lower surface of lower member 72 to extend along the edge opposed to the cup 64.

The lower member 72 defines a plurality of threaded bores 93 arranged along the edge thereof opposed to the cup 64 for receiving the bolts 74, and a plurality of threaded bores 94 arranged along an edge thereof opposed to the wafer W for receiving the bolts 75.

Figure 26:
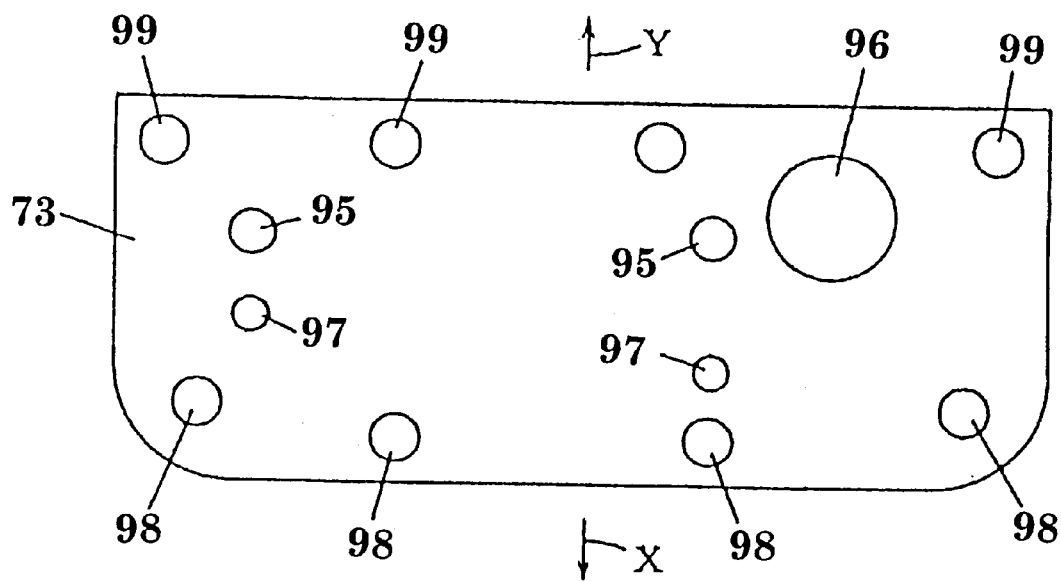
FIG. 26 is a plan view of a sheet packing of the nozzle in the third embodiment.

FIG. 26 is a plan view of sheet packing 73. As shown in FIG. 26, the sheet packing 73 defines a communicating bore 96 for communicating the solution receiving portion 84 of upper member 71 with the recess 85a of lower member 72, communicating bores 95 for communicating the grooves 88a of upper member 71 with the recess 85a of lower member 72, and communicating bores 97 for communicating the grooves 88a of upper member 71 with the discharge passages 87a of lower member 72.

The sheet packing 73 further defines a plurality of threaded bores 98 arranged along an edge thereof opposed to the cup 64 for receiving the bolts 74, and a plurality of threaded bores 99 arranged along an edge thereof opposed to the wafer W for receiving the bolts 75.

The sheet packing 73 shown in FIG. 26 is placed between the lower surface of upper member 71 shown in FIGS. 24A–24D and the upper surface of lower member 72 shown in FIGS. 25A–25E. Then, the bolts 74 are screwed through the threaded bores 91, 98 and 93, and the bolts 75 through the threaded bores 92, 99 and 94 to join the upper member 71, sheet packing 73 and lower member 72 in a communicating relationship, thereby forming the trap 85 and upper passages 88 shown in FIGS. 23A–23C.

In the nozzle 70 of this embodiment, as shown in FIG. 23B, the upper ends of discharge passages 87 communicate with the lower end of trap 85 through the inclined passages 86, whereby bubbles can hardly enter the trap 85 from the discharge openings 82. Bubbles entering the trap 85, if any, will tend to collect in upper regions of trap 85 instead of moving through the inclined passages 86 and out of the discharge openings 82. Such bubbles will tend to collect particularly in the trap 85 adjacent the ends thereof and adjacent the solution receiving portion 84. As shown in FIG. 23C, the discharge passages 87a adjacent the ends of trap 85 and adjacent the solution receiving portion 84 communicate with the upper end of trap 85 through the upper passages 88. Thus, the bubbles collected in the upper regions of trap 85 are easily released through the upper passages 88 and discharge passages 87a and out through the discharge openings 82.

This construction effectively avoids supplying of the developer with bubbles mixed therein, and spilling of the developer due to expansion of bubbles after completion of developer supply. As a result, no defective development occurs due to bubble mixed into the solution.

Figure 27:
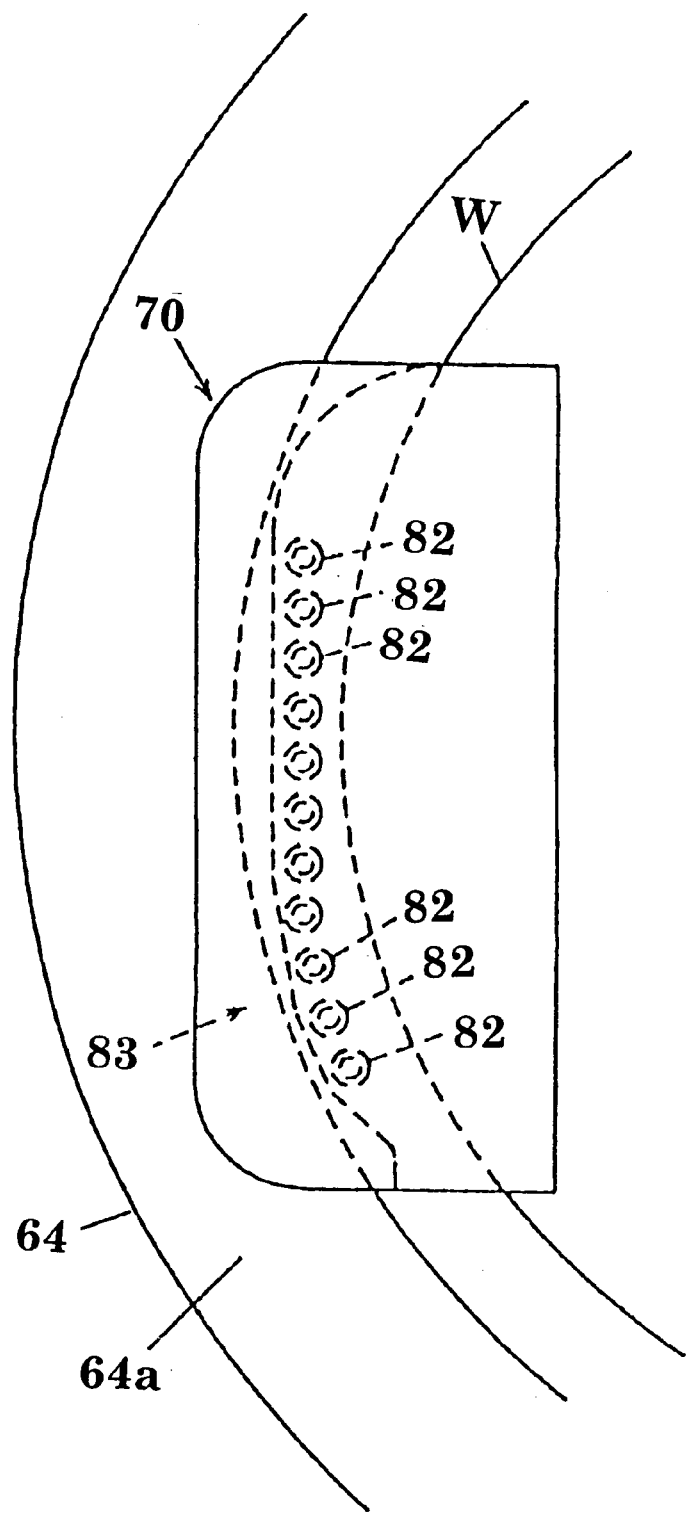
FIG. 27 is a plan view showing discharge openings of the nozzle in the third embodiment arranged between an outer edge of a substrate and an inner edge of a tapered portion of a cup.
Figure 28:
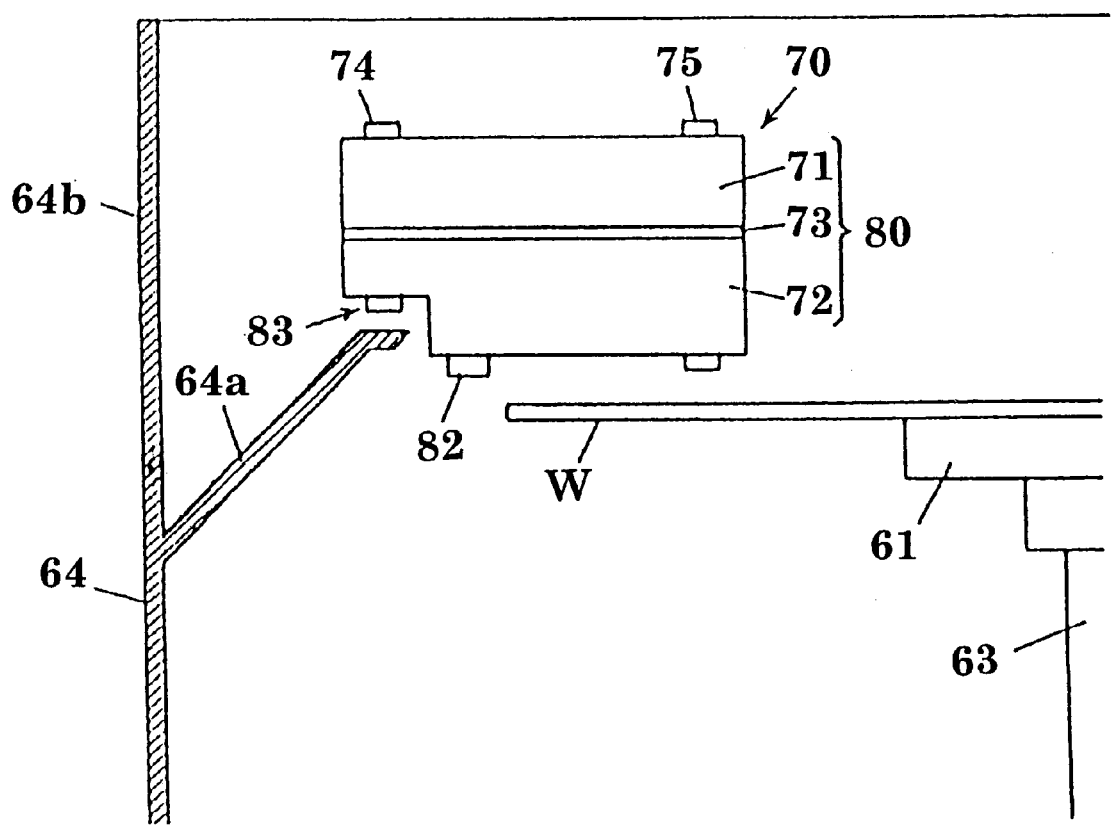
FIG. 28 is a front view showing the discharge openings of the nozzle in the third embodiment arranged between the outer edge of the substrate and the inner edge of the tapered portion of the cup.

FIGS. 27 and 28 are a plan view and a front view showing the discharge openings 82 of nozzle 70 arranged between the outer edge of wafer W and the inner edge of the tapered portion 64a of cup 64.

In the nozzle 70 of this embodiment, at least part of the discharge openings 82 are arranged arcuately to follow the outer edge of wafer W. Even where only a narrow space is provided between the edge of wafer W and the tapered portion 64a of cup 64, all the discharge openings 82 may be arranged between the outer edge of wafer W and the inner edge of the tapered portion 64a of cup 64 as shown in FIG. 27.

As noted hereinbefore, the cutout recess 83 is formed in the lower surface of nozzle 70, which extends along the edge opposed to the cup 64. Thus, even where only a narrow space is provided between the outer edge of wafer W and the tapered portion 64a of cup 64, the discharge openings 82 may be arranged between the outer edge of wafer W and the inner edge of the tapered portion 64a of cup 64 by positioning the cutout recess 83 over the inner edge of the tapered portion 64a as shown in FIG. 28.

It is therefore possible, when starting to supply the developer through the nozzle 70, to allow the developer to drip into the space between wafer W and cup 64 and move the nozzle 70 over the spinning wafer W while discharging the developer from the nozzle 70. In this way, the developer may be supplied uniformly over the entire surface of wafer W while avoiding the impact of the developer being applied to the photosensitive film on the wafer W upon start of the discharge.

There is no need to form a cutout in the tapered portion 64a of cup 64 or to enlarge the opening of cup 64. Thus, a good performance of cup 64 is secured. Mist of the developer is prevented from leaking from the cup 64. Uneven development due to gas currents flowing past the spinning wafer W may also be avoided. The above facts enable a uniform developing treatment. As a further advantage, the cup 64 may be reduced in size to provide for a compact developing apparatus as a whole.

In the nozzle 70 of this embodiment, part of the discharge openings 82 are arranged arcuately to follow the edge of wafer W. Instead, all of the discharge openings 82 may be arranged arcuately to following the edge of wafer W. Further, at least part of the discharge openings 82 may be arranged stepwise to extend approximately along the edge of wafer W.

Figure 29:
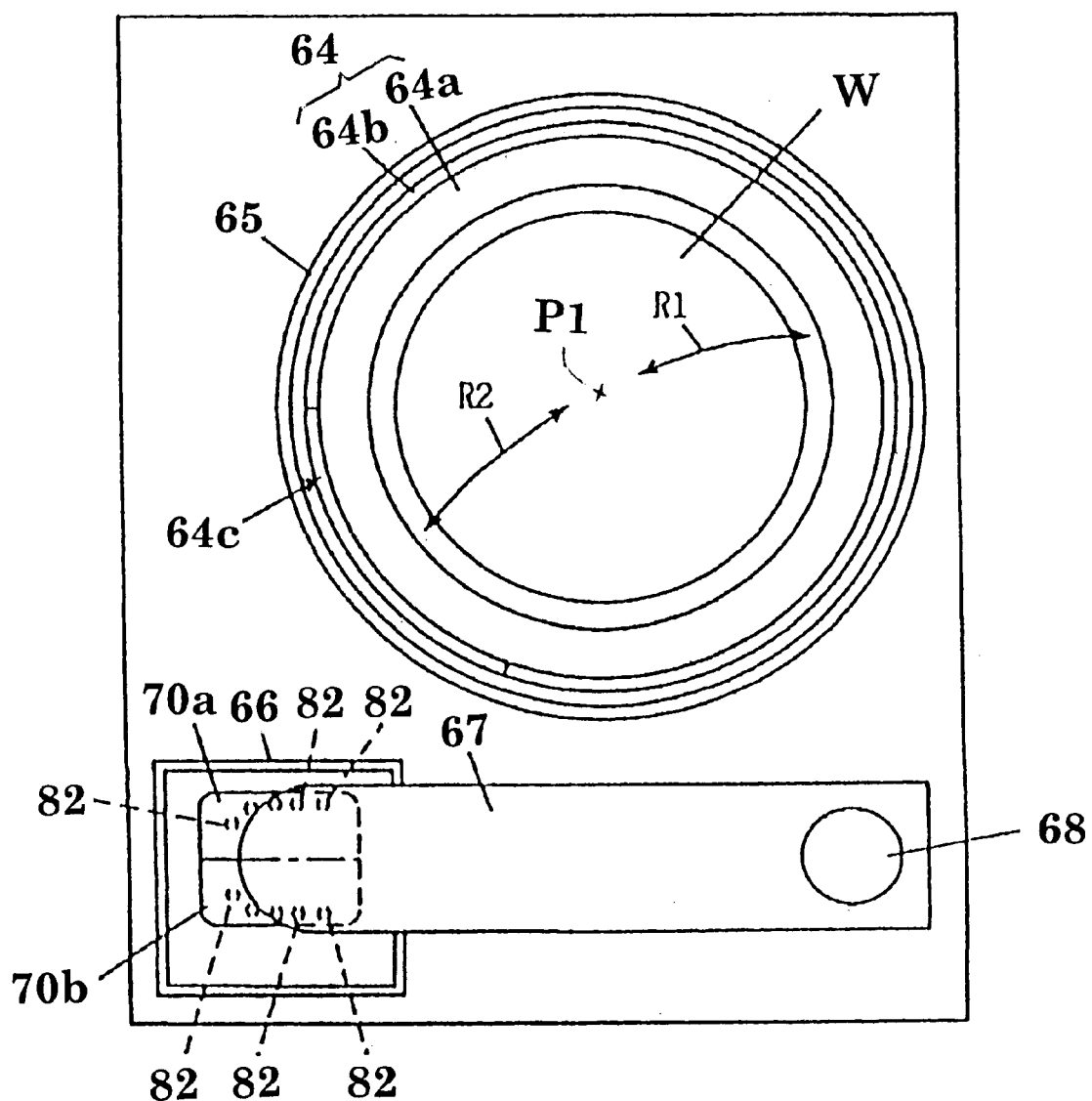
FIG. 29 is a plan view of a modification of the substrate developing apparatus in the third embodiment.

FIG. 29 is a plan view of a modification of the substrate developing apparatus in the third embodiment.

In the developing apparatus of FIG. 29, two nozzles 70a and 70b are attached to the lower surface at the distal end of support arm 67. One of the nozzles 70a has a plurality of discharge openings 82 arranged arcuately in a lower surface thereof to follow an edge of wafer W. The other nozzle 70b has a plurality of discharge openings 82 arranged arcuately in a lower surface thereof to follow an opposite edge of wafer W. The nozzles 70a and 70b are arranged such that the discharge openings 82 are at different distances from the spin center of wafer W when the nozzles 70a and 70b are moved radially of wafer W.

This developing apparatus allows use of two types of developers. When the nozzle 70a is used, the distal end of support arm 67 is moved from an edge to the center of wafer W, as indicated by an arrow R1, while discharging the developer from the nozzle 70a. When the other nozzle 70b is used, the distal end of support arm 67 is moved from an opposite edge to the center of wafer W, as indicated by an arrow R2, while discharging the developer from the nozzle 70b. Whichever nozzle 70a or 70b is used, the discharge openings 82 describe loci not overlapping one another, thereby to supply the developer uniformly over the wafer W.

This developing apparatus also secures a good performance of cup 64, avoids the impact of the developer being applied to the photosensitive film on the wafer W upon start of the discharge, and supplies the developer uniformly over the entire surface of wafer W. The cup 64 may be reduced in size to provide for a compact developing apparatus as a whole. Besides, no defective development occurs due to bubble mixed into the solution.

In each of the foregoing embodiments, the present invention is applied to the developer discharge nozzle and developing apparatus. The invention is applicable to discharge nozzles for discharging other treating solutions and substrate treating apparatus employing such nozzles. These nozzles and apparatus include, for example, a nozzle for discharging a coating solution such as a resist solution and a coating apparatus employing this nozzle.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate by supplying a treating solution thereto, comprising:

spin support means for supporting and spinning the substrate;

treating solution supply means having a plurality of discharge openings for discharging the treating solution, said discharge openings being arranged at different distances from a spin center of said substrate, in two rows and in a staggered relationship; and moving means for moving said treating solution supply means radially of said substrate.

2. A substrate treating apparatus as defined in claim 1, wherein said treating solution is a developer.

3. A substrate treating apparatus as defined in claim 1, wherein said treating solution supply means comprises a nozzle having said plurality of discharge openings.

4. A substrate treating apparatus as defined in claim 3, wherein said plurality of discharge openings are formed in a bottom of said nozzle.

5. A substrate treating apparatus as defined in claim 3, wherein said moving means is operable to swing said nozzle radially of the substrate.

6. A substrate treating apparatus as defined in claim 3, wherein said moving means is operable to move said nozzle linearly radially of the substrate.

7. A substrate treating apparatus for treating a substrate by supplying a treating solution thereto, comprising:

spin support means for supporting and spinning the substrate;

treating solution supply means having a plurality of discharge openings for discharging the treating solution, said discharge openings being arranged at different distances from a spin center of said substrate, and moving means for moving said treating solution supply means radially of said substrate, wherein said treating solution supply means comprises a nozzle having said plurality of discharge openings; and wherein said nozzle includes a nozzle body having said plurality of discharge openings formed in a bottom thereof, said nozzle body defining a trap for receiving said treating solution, a plurality of discharge passages extending upward from said plurality of discharge openings, respectively, and a plurality of communicating passages for communicating said discharge passages with said trap, said plurality of communicating passages being reversing passages for leading said treating solution from a lower end of said trap to upper ends of said discharge passages.

8. A substrate treating apparatus as defined in claim 7, wherein said discharge passages are formed thinner than said reversing passages.

9. A substrate treating apparatus as defined in claim 7, wherein said reversing passages are inclined passages extending from said lower end of said trap to said upper ends of said discharge passages.

10. A substrate treating apparatus as defined in claim 7, wherein said apparatus is operable, when said discharge openings are displaced from above said substrate, to supply said treating solution into said nozzle body and discharge said treating solution from said discharge openings, thereby to discharge air with said treating solution from said nozzle body, and after discharging the air from said nozzle body, to supply said treating solution to said substrate.

11. A substrate treating apparatus as defined in claim 7, wherein part of said plurality of communicating passages are upper passages for communicating the upper ends of said discharge passages and an upper end of said trap.

12. A substrate treating apparatus as defined in claim 11, wherein said nozzle body includes a solution receiving portion continuous with the upper end of said trap, said upper passages being connected to positions of said trap adjacent said solution receiving portion.

13. A substrate treating apparatus as defined in claim 11, wherein said plurality of discharge openings are arranged in a row, said trap extending along a direction of arrangement of said discharge openings, said upper passages being connected to positions adjacent ends of said trap.

* * * * *